(12) United States Patent
Yan et al.

(10) Patent No.: US 12,237,820 B2
(45) Date of Patent: Feb. 25, 2025

(54) ATTENUATORS HAVING PHASE SHIFT AND GAIN COMPENSATION CIRCUITS

(71) Applicant: SKYWORKS SOLUTIONS, INC., Woburn, MA (US)

(72) Inventors: Yan Yan, Irvine, CA (US); Junhyung Lee, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 15/687,475

(22) Filed: Aug. 26, 2017

(65) Prior Publication Data

US 2018/0062621 A1 Mar. 1, 2018

Related U.S. Application Data

(60) Provisional application No. 62/381,367, filed on Aug. 30, 2016.

(51) Int. Cl.
*H03H 11/24* (2006.01)
*H03F 1/02* (2006.01)
(Continued)

(52) U.S. Cl.
CPC ......... *H03H 11/245* (2013.01); *H03F 1/0277* (2013.01); *H03F 3/19* (2013.01); *H03F 3/195* (2013.01); *H03F 3/211* (2013.01); *H03F 3/72* (2013.01); *H03G 1/0029* (2013.01); *H03G 1/0088* (2013.01); *H03G 3/3042* (2013.01); *H03G 3/3063* (2013.01); *H03H 7/25* (2013.01);
(Continued)

(58) Field of Classification Search
CPC .. H03H 11/16; H03H 11/245; H03H 17/0045; H03F 1/56; H03F 2200/211
See application file for complete search history.

(56) References Cited

U.S. PATENT DOCUMENTS 8,779,870 B2 * 7/2014 Sun .......................... H03H 7/07
333/81 R
9,531,359 B1 * 12/2016 Shrivastava ............. H03K 5/08
(Continued)

FOREIGN PATENT DOCUMENTS

CN 104518754 A 4/2015
CN 104852706 A 8/2015
(Continued)

OTHER PUBLICATIONS

ISR and WOSA dated Jan. 10, 2018 for PCT/US2017/048916.
ISR and WOSA dated Jan. 9, 2018 for PCT/US2017/048917.

*Primary Examiner* — Ryan Johnson
*Assistant Examiner* — Colleen J O Toole
(74) *Attorney, Agent, or Firm* — Chang & Hale LLP

(57) ABSTRACT

Attenuators having phase shift and gain compensation circuits. In some embodiments, a radio-frequency (RF) attenuator circuit can include one or more attenuation blocks arranged in series between an input node and an output node, with each attenuation block including a local bypass path. The RF attenuator circuit can further include a global bypass path implemented between the input node and the output node. The RF attenuator circuit can further include a phase compensation circuit configured to compensate for an off-capacitance effect associated with at least one of the global bypass path and the one or more local bypass paths.

17 Claims, 16 Drawing Sheets

(51) Int. Cl.
  *H03F 3/19* (2006.01)
  *H03F 3/195* (2006.01)
  *H03F 3/21* (2006.01)
  *H03F 3/72* (2006.01)
  *H03G 1/00* (2006.01)
  *H03G 3/30* (2006.01)
  *H03H 7/25* (2006.01)
  *H04B 1/40* (2015.01)

(52) U.S. Cl.
  CPC .. *H03F 2200/294* (2013.01); *H03F 2200/451* (2013.01); *H03F 2203/7215* (2013.01); *H03F 2203/7221* (2013.01); *H03G 2201/106* (2013.01); *H04B 1/40* (2013.01)

(56) References Cited

U.S. PATENT DOCUMENTS

| | | | |
|---|---|---|---|
| 9,548,722 B2 * | 1/2017 | Atesal | H03H 11/245 |
| 9,602,091 B1 * | 3/2017 | Sharma | H03H 7/24 |
| 2006/0244548 A1 | 11/2006 | Noest et al. | |
| 2008/0198954 A1 | 8/2008 | Uribe | |
| 2011/0133868 A1 | 6/2011 | Jansen | |
| 2011/0140755 A1 * | 6/2011 | Hong | H03H 7/25 327/308 |
| 2013/0043962 A1 | 2/2013 | Granger-Jones | |
| 2013/0088403 A1 | 4/2013 | Sun et al. | |
| 2014/0253259 A1 | 9/2014 | Holland | |
| 2015/0318889 A1 * | 11/2015 | Lee | H04B 1/44 455/78 |
| 2015/0326205 A1 | 11/2015 | Cho | |
| 2016/0118959 A1 | 4/2016 | Atesal et al. | |
| 2016/0134259 A1 | 5/2016 | Shrivastava | |

FOREIGN PATENT DOCUMENTS

| | | |
|---|---|---|
| CN | 201780064934.3 | 4/2019 |
| DE | 112017004371.9 | 2/2019 |
| GB | 19043264 | 3/2019 |
| JP | 10-041774 A | 2/1998 |
| JP | 2003-309454 A | 10/2003 |
| JP | 2005-086310 A | 3/2005 |
| JP | 2010-252241 A | 11/2010 |
| JP | 2011-182048 A | 9/2011 |
| JP | 2014-096725 A | 5/2014 |
| JP | 2019-531560 | 2/2019 |
| JP | 2022-075655 | 5/2022 |
| KR | 10-2019-7008829 | 3/2019 |
| SG | 11201901791 T | 2/2019 |
| TW | 106129620 | 8/2017 |
| TW | 111100546 | 1/2022 |
| WO | 2009145957 | 12/2009 |
| WO | 2010058244 | 5/2010 |
| WO | PCT/US2017/048916 | 8/2017 |

* cited by examiner

ATTENUATORS HAVING PHASE SHIFT AND GAIN COMPENSATION CIRCUITS

CROSS-REFERENCE TO RELATED APPLICATION(S)

This application claims priority to U.S. Provisional Application No. 62/381,367 filed Aug. 30, 2016, entitled ATTENUATORS HAVING PHASE SHIFT AND GAIN COMPENSATION CIRCUITS, the disclosure of which is hereby expressly incorporated by reference herein in its respective entirety.

BACKGROUND

Field

The present disclosure relates to attenuators for electronic applications.

Description of the Related Art

In electronic applications such as radio-frequency (RF) applications, it is sometimes desirable to amplify or attenuate a signal. For example, a to-be-transmitted signal can be amplified by a power amplifier, and a received signal can be amplified by a low-noise amplifier. In another example, one or more attenuators can be implemented along either or both of the foregoing transmit and receive paths as needed or desired to attenuate the respective signal(s).

SUMMARY

In accordance with a number of implementations, the present disclosure relates to a radio-frequency (RF) attenuator circuit that includes one or more attenuation blocks arranged in series between an input node and an output node, with each attenuation block including a local bypass path. The RF attenuator circuit further includes a global bypass path implemented between the input node and the output node. The RF attenuator circuit further includes a phase compensation circuit configured to compensate for an off-capacitance effect associated with at least one of the global bypass path and the one or more local bypass paths.

In some embodiments, the global bypass path can include a global bypass switching transistor configured to be on when in a global bypass mode and off when in a global attenuation mode, such that the global bypass switching transistor provides a global off-capacitance when in the global attenuation mode. The phase compensation circuit can include a global phase compensation circuit configured to compensate for the global off-capacitance when the radio-frequency attenuator circuit is in the global attenuation mode.

In some embodiments, the global phase compensation circuit can include a first global compensation resistance and a second global compensation resistance arranged in series between the input node and the output node, and a global compensation capacitance implemented between a ground and a node between the first and second global compensation resistances. The global off-capacitance of the global bypass switching transistor can result in a phase lead change, and the global phase compensation circuit can be configured to provide a phase lag change to compensate for the phase lead change. The first and second global compensation resistances can have substantially the same value. The phase lead change can be by an amount calculated as $$\phi = \tan^{-1}(2\omega R_{G1}C_{off}) - \tan^{-1}\left(\frac{2}{3}\omega R_{G1}C_{off}\right),$$

and the phase lag change can be by an amount calculated as $$\phi = -\tan^{-1}\left(\frac{2}{3}\omega R_{G1}C_G\right),$$

where $\omega$ is $2\pi$ times frequency, $R_L$ is load impedance, $R_{G1}$ is the first global compensation resistance, and $C_G$ is the global compensation capacitance. The values of the first global compensation resistance and the global compensation capacitance can be selected such that magnitude of the phase lag change is substantially the same as magnitude of the phase lead change. The value of the global compensation capacitance can be selected such that a global gain of the attenuator circuit is approximately flat over a selected frequency range.

In some embodiments, the global compensation capacitance can be configured to be affected substantially the same as the global bypass switching transistor by one or more process variations. The global compensation capacitance can be configured as a transistor-like device. Each of the transistor-like device of the global compensation capacitance and the global bypass switching transistor can be implemented as a MOSFET device.

In some embodiments, the local bypass path can include a local bypass switching transistor configured to be on when in a local bypass mode and off when in a local attenuation mode, such that the local bypass switching transistor provides a local off-capacitance when in the local attenuation mode. The phase compensation circuit can include a local phase compensation circuit configured to compensate for the local off-capacitance when the radio-frequency attenuator circuit is in the local attenuation mode.

In some embodiments, the attenuation block can be configured as a pi-attenuator having a local resistance, a first shunt path implemented between one end of the local resistance and a ground, and a second shunt path implemented between the end of the local resistance and the ground, with each of the first and second shunt paths including a shunt resistance. The local phase compensation circuit can include a first local compensation capacitance arranged to be electrically parallel with the first shunt resistance, and a second local compensation capacitance arranged to be electrically parallel with the second shunt resistance.

In some embodiments, the local off-capacitance of the local bypass switching transistor can result in a phase lead change, and the local phase compensation circuit can be configured to provide a phase lag change to compensate for the phase lead change. The first and second shunt resistances can have substantially the same value, and the first and second local compensation capacitances can have substantially the same value. The phase lead change can be by an amount calculated as $$\phi = \tan^{-1}(\omega R_1 C_{off}) - \tan^{-1}\left(\omega\left(\frac{R_1 R_L}{R_1 + R_L}\right)C_{off}\right),$$

and the phase lag change can be by an amount calculated as $$\phi = -\tan^{-1}\left(\frac{\omega R_1 R_2' C_c}{R_1 + R_2'}\right),$$

where $\omega$ is $2\pi$ times frequency, $R_L$ is load impedance, $R_1$ is the local resistance, and $C_C$ is the first local compensation capacitance, and $R_2'$ is an equivalent resistance of a parallel arrangement of the first shunt resistance and the load impedance. The value of the first local compensation capacitance can be selected such that magnitude of the phase lag change is substantially the same as magnitude of the phase lead change. The value of the local compensation capacitance can be selected such that a local gain of the attenuation block is approximately flat over a selected frequency range.

In some embodiments, each of the first and second local compensation capacitances can be configured to be affected substantially the same as the local bypass switching transistor by one or more process variations. Each of the first and second local compensation capacitances can be configured as a transistor-like device. Each of the transistor-like device of the first and second local compensation capacitances and the local bypass switching transistor can be implemented as a MOSFET device.

In some embodiments, the one or more attenuation blocks can include a plurality of attenuation blocks having binary-weighted attenuation values.

In some teachings, the present disclosure relates to a semiconductor die having a radio-frequency circuit. The semiconductor die includes a semiconductor substrate, and an attenuator circuit implemented on the semiconductor substrate. The attenuator circuit includes one or more attenuation blocks arranged in series between an input node and an output node, with each attenuation block including a local bypass path. The attenuator circuit further includes a global bypass path implemented between the input node and the output node. The attenuator circuit further includes a phase compensation circuit configured to compensate for an off-capacitance effect associated with at least one of the global bypass path and the one or more local bypass paths.

In a number of implementations, the present disclosure relates to a radio-frequency module that includes a packaging substrate configured to receive a plurality of components, and a radio-frequency attenuator circuit implemented on the packaging substrate. The attenuator circuit includes one or more attenuation blocks arranged in series between an input node and an output node, with each attenuation block including a local bypass path. The attenuator circuit further includes a global bypass path implemented between the input node and the output node. The attenuator circuit further includes a phase compensation circuit configured to compensate for an off-capacitance effect associated with at least one of the global bypass path and the one or more local bypass paths.

In some embodiments, some or all of the radio-frequency attenuator circuit can be implemented on a semiconductor die. In some embodiments, substantially all of the radio-frequency attenuator circuit can be implemented on the semiconductor die.

In some embodiments, the radio-frequency module can be configured to process a received radio-frequency signal. The radio-frequency module can be a diversity receive module.

In some embodiments, the radio-frequency module can further include a controller in communication with the radio-frequency attenuator circuit and configured to provide a control signal for operation of the radio-frequency attenuator circuit. The controller can be configured to provide, for example, a Mobile Industry Processor Interface control signal.

According to some implementations, the present disclosure relates to a wireless device that includes an antenna configured to receive a radio-frequency signal, a transceiver in communication with the antenna, and a signal path between the antenna and the transceiver. The wireless device further includes a radio-frequency attenuator circuit implemented along the signal path. The attenuator circuit includes one or more attenuation blocks arranged in series between an input node and an output node, with each attenuation block including a local bypass path. The attenuator circuit further includes a global bypass path implemented between the input node and the output node. The attenuator circuit further includes a phase compensation circuit configured to compensate for an off-capacitance effect associated with at least one of the global bypass path and the one or more local bypass paths.

In some embodiments, the wireless device can further include a controller in communication with the radio-frequency attenuator circuit and configured to provide a control signal for operation of the radio-frequency attenuator circuit. The controller can be configured to provide, for example, a Mobile Industry Processor Interface control signal.

In some implementations, the present disclosure relates to a signal attenuator circuit that includes one or more local attenuation blocks arranged in series between an input node and an output node, with each attenuation block including a local bypass path. The signal attenuation circuit further includes a global bypass path implemented between the input node and the output node. The signal attenuation circuit further includes a global phase compensation circuit configured to compensate for an off-capacitance effect associated with the global bypass path.

In some implementations, the present disclosure relates to a signal attenuator circuit that includes one or more local attenuation blocks arranged in series between an input node and an output node, with each attenuation block including a local bypass path. The signal attenuator circuit further includes a global bypass path implemented between the input node and the output node. The signal attenuator circuit further includes a local phase compensation circuit associated at least one of the one or more local attenuation blocks. The local phase compensation circuit is configured to compensate for an off-capacitance effect associated with the respective local bypass path.

According to some implementations, the present disclosure relates to a signal attenuator circuit that includes one or more local attenuation blocks arranged in series between an input node and an output node, with each attenuation block including a local bypass path. The signal attenuator circuit further includes a global bypass path implemented between the input node and the output node. The signal attenuator circuit further includes a global phase compensation circuit configured to compensate for an off-capacitance effect associated with the global bypass path. The signal attenuator circuit further includes a local phase compensation circuit associated at least one of the one or more local attenuation blocks. The local phase compensation circuit is configured to compensate for an off-capacitance effect associated with the respective local bypass path.

According to a number of implementations, the present disclosure relates to a semiconductor die that includes a semiconductor substrate, and a signal attenuator circuit implemented on the semiconductor substrate. The signal attenuator circuit includes one or more local attenuation blocks arranged in series between an input node and an output node, with each attenuation block including a local bypass path. The signal attenuator circuit further includes a global bypass path implemented between the input node and the output node. The signal attenuator further includes a global phase compensation circuit configured to compensate for an off-capacitance effect associated with the global bypass path.

According to a number of implementations, the present disclosure relates to a semiconductor die that includes a semiconductor substrate, and a signal attenuator circuit implemented on the semiconductor substrate. The signal attenuator circuit includes one or more local attenuation blocks arranged in series between an input node and an output node, with each attenuation block including a local bypass path. The signal attenuator circuit further includes a global bypass path implemented between the input node and the output node. The signal attenuator circuit further includes a local phase compensation circuit associated at least one of the one or more local attenuation blocks. The local phase compensation circuit is configured to compensate for an off-capacitance effect associated with the respective local bypass path.

According to a number of implementations, the present disclosure relates to a semiconductor die that includes a semiconductor substrate, and a signal attenuator circuit implemented on the semiconductor substrate. The signal attenuator circuit includes one or more local attenuation blocks arranged in series between an input node and an output node, with each attenuation block including a local bypass path. The signal attenuator circuit further includes a global bypass path implemented between the input node and the output node, and a global phase compensation circuit configured to compensate for an off-capacitance effect associated with the global bypass path. The signal attenuator circuit further includes a local phase compensation circuit associated at least one of the one or more local attenuation blocks. The local phase compensation circuit is configured to compensate for an off-capacitance effect associated with the respective local bypass path.

In some implementations, the present disclosure relates to a radio-frequency module that includes a packaging substrate configured to receive a plurality of components, and a signal attenuator circuit implemented on the packaging substrate. The signal attenuator circuit includes one or more local attenuation blocks arranged in series between an input node and an output node, with each attenuation block including a local bypass path. The signal attenuator circuit further includes a global bypass path implemented between the input node and the output node. The signal attenuator further includes a global phase compensation circuit configured to compensate for an off-capacitance effect associated with the global bypass path.

In some implementations, the present disclosure relates to a radio-frequency module that includes a packaging substrate configured to receive a plurality of components, and a signal attenuator circuit implemented on the packaging substrate. The signal attenuator circuit includes one or more local attenuation blocks arranged in series between an input node and an output node, with each attenuation block including a local bypass path. The signal attenuator circuit further includes a global bypass path implemented between the input node and the output node. The signal attenuator circuit further includes a local phase compensation circuit associated at least one of the one or more local attenuation blocks. The local phase compensation circuit is configured to compensate for an off-capacitance effect associated with the respective local bypass path.

In some implementations, the present disclosure relates to a radio-frequency module that includes a packaging substrate configured to receive a plurality of components, and a signal attenuator circuit implemented on the packaging substrate. The signal attenuator circuit includes one or more local attenuation blocks arranged in series between an input node and an output node, with each attenuation block including a local bypass path. The signal attenuator circuit further includes a global bypass path implemented between the input node and the output node, and a global phase compensation circuit configured to compensate for an off-capacitance effect associated with the global bypass path. The signal attenuator circuit further includes a local phase compensation circuit associated at least one of the one or more local attenuation blocks. The local phase compensation circuit is configured to compensate for an off-capacitance effect associated with the respective local bypass path.

In some implementations, the present disclosure relates to a wireless device that includes an antenna configured to receive a radio-frequency signal, a transceiver in communication with the antenna, a signal path between the antenna and the transceiver. The wireless device further includes a signal attenuator circuit implemented along the signal path. The signal attenuator circuit includes one or more local attenuation blocks arranged in series between an input node and an output node, with each attenuation block including a local bypass path. The signal attenuator circuit further includes a global bypass path implemented between the input node and the output node. The signal attenuator further include a global phase compensation circuit configured to compensate for an off-capacitance effect associated with the global bypass path.

In some implementations, the present disclosure relates to a wireless device that includes an antenna configured to receive a radio-frequency signal, a transceiver in communication with the antenna, a signal path between the antenna and the transceiver. The wireless device further includes a signal attenuator circuit implemented along the signal path. The signal attenuator circuit includes one or more local attenuation blocks arranged in series between an input node and an output node, with each attenuation block including a local bypass path. The signal attenuator circuit further includes a global bypass path implemented between the input node and the output node. The signal attenuator circuit further includes a local phase compensation circuit associated at least one of the one or more local attenuation blocks. The local phase compensation circuit is configured to compensate for an off-capacitance effect associated with the respective local bypass path.

In some implementations, the present disclosure relates to a wireless device that includes an antenna configured to receive a radio-frequency signal, a transceiver in communication with the antenna, a signal path between the antenna and the transceiver. The wireless device further includes a signal attenuator circuit implemented along the signal path. The signal attenuator circuit includes one or more local attenuation blocks arranged in series between an input node and an output node, with each attenuation block including a local bypass path. The signal attenuator circuit further includes a global bypass path implemented between the input node and the output node, and a global phase compensation circuit configured to compensate for an off-capacitance effect associated with the global bypass path. The signal attenuator circuit further includes a local phase compensation circuit associated at least one of the one or more local attenuation blocks. The local phase compensation circuit is configured to compensate for an off-capacitance effect associated with the respective local bypass path.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Disclosed herein are various examples of circuits, devices and methods related to attenuators that can be utilized in, for example, radio-frequency (RF) applications. Although various examples are described herein in the context of RF applications, it will be understood that such circuits, devices and methods related to attenuators can be utilized in other electronic applications.

Figure 1:
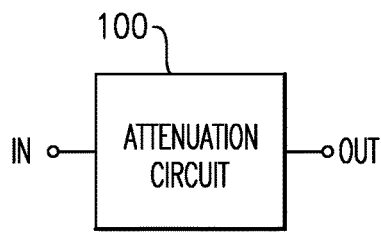
FIG. 1 depicts an attenuator circuit configured to receive a signal at an input node and generate an attenuated signal at an output node.

FIG. 1 depicts an attenuator circuit 100 configured to receive an RF signal at an input node (IN) and generate an attenuated RF signal at an output node (OUT). Such an attenuator circuit can include one or more features as described herein so as to provide desirable functionalities such as phase shift compensation, gain compensation, and low loss bypass capability. As described herein, such phase compensation can provide, for example, an approximately zero phase shift resulting from an attenuation block and/or the attenuator circuit itself. As also described herein, such gain compensation can provide, for example, an approximately flat gain over a frequency range.

It is noted that phase variation and gain slope are generally not desired when an input signal passes through an attenuator, since such effects can cause performance degradation in a communication link. In some embodiments, the attenuation circuit 100 of FIG. 1 can include a global compensation scheme and/or a local compensation scheme to address the phase variation problem. As described herein, such compensation schemes can be configured to address sources of such phase variations. As also described herein, such compensation schemes can also provide an approximately flat gain over a relatively wide frequency range. As also described herein, such compensation schemes can also provide a bypass path having relatively low loss which is desirable for keeping signal attenuation to a minimum under some situations (e.g., when an attenuation path is not being used).

For the purpose of description, an attenuation circuit can also be referred to as an attenuator assembly or simply an attenuator. Description of such an attenuation circuit, attenuator assembly, attenuator, etc. can apply to one or more attenuation blocks (also referred to herein as local attenuation), overall attenuation circuit (also referred to herein as global attenuation), or any combination thereof.

Figure 2:
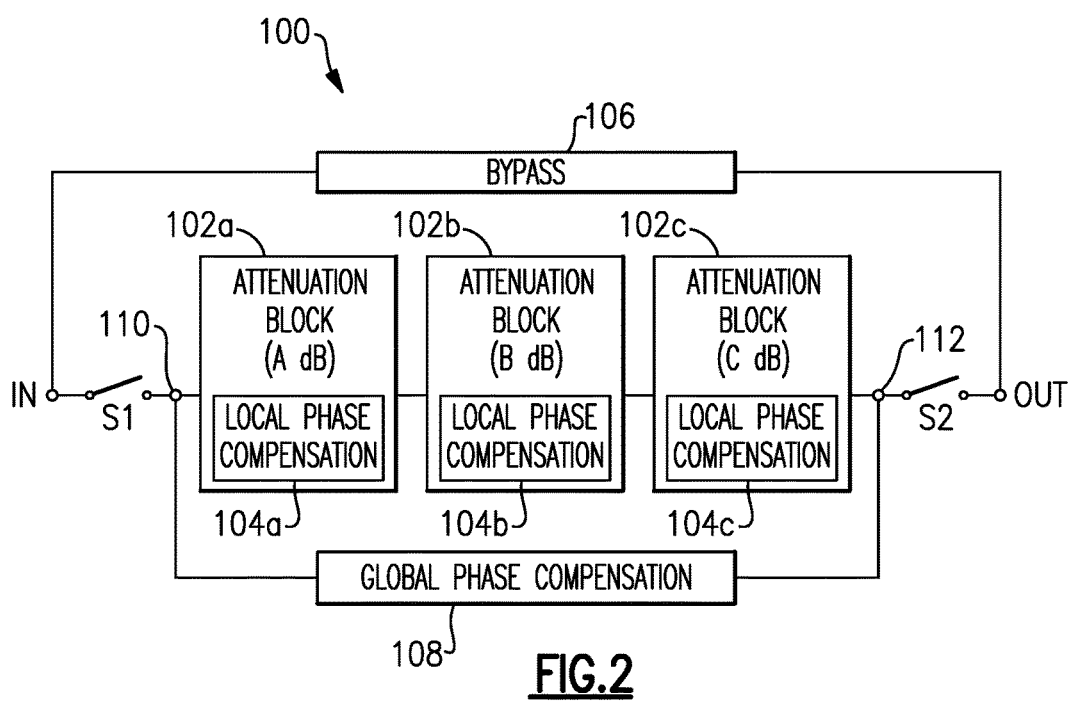
FIG. 2 shows a block diagram of an attenuation circuit having a bypass path, a global phase compensation circuit, and a local phase compensation circuit.

FIG. 2 shows a block diagram of an attenuation circuit 100 configured to receive an RF signal at its input node (IN) and provide an output RF signal at its output node (OUT). Such an output RF signal can be attenuated by one or more attenuation values, or be substantially the same as the input RF signal (e.g., through bypass functionality) when attenuation is not desired. Examples of how such attenuation values and bypass functionality can be implemented are described herein in greater detail. Also described herein are examples of how phase compensation can be implemented at a local attenuation level, at a global level, or any combination thereof.

In the example of FIG. 2, the input (IN) and output (OUT) nodes of the attenuation circuit 100 can be coupled through one or more attenuation blocks 102a, 102b, 102c, or through a bypass path 106. To achieve the former, each of two switches S1, S2 can be closed, and the bypass path 106 can be configured appropriately. To achieve the latter, each of the switches S1, S2 can be opened, and the bypass path 106 can be configured appropriately. Examples of such attenuation blocks and bypass path are described herein in greater detail.

In the example of FIG. 2, as well as in other figures, an attenuation path is depicted as having three example attenuation blocks A, B and C. However, it will be understood that one or more features of the present disclosure can also be implemented in attenuation circuits having more or less numbers of attenuation blocks. It will also be understood that attenuation circuits having one or more features as described herein can operate in reverse.

Referring to FIG. 2, the first example attenuation block 102a is shown to provide A dB attenuation. Similarly, the second and third attenuation blocks 102b, 102c are shown to provide B dB and C dB attenuations, respectively. Thus, a number of total attenuation values (e.g., A dB, B dB, C dB, A+B dB, A+C dB, B+C dB, A+B+C dB) can be achieved utilizing such attenuation blocks.

In the example of FIG. 2, each of the attenuation blocks 102a, 102b, 102c is shown to include a respective local phase compensation circuit (104a, 104b or 104c). Examples related to such local phase compensation circuits are described herein in greater detail. In the example of FIG. 2, all of the attenuation blocks are shown to have respective local phase compensation circuits. However, it will be understood that in some embodiments, one or more attenuation blocks may or may not have such local phase compensation circuit(s).

In the example of FIG. 2, the attenuation circuit 100 is also shown to include a global phase compensation circuit 108. Such a global phase compensation circuit can be implemented between nodes that are before (110) and after (112) the attenuation blocks (102a, 102b, 102c). Examples related to such a global phase compensation circuit are described herein in greater detail.

In some embodiments, attenuation blocks (e.g., 102a, 102b, 102c of FIG. 2) having one or more features as described herein can be implemented in a binary-weighted configuration. Examples related to such a binary-weighted configuration are described in U.S. patent application Ser. No. 15/687,476, entitled BINARY-WEIGHTED ATTENUATOR HAVING COMPENSATION CIRCUIT, the disclosure of which is filed on even date herewith and hereby incorporated by reference herein in its entirety and to be considered part of the specification of the present application.

Figure 3:
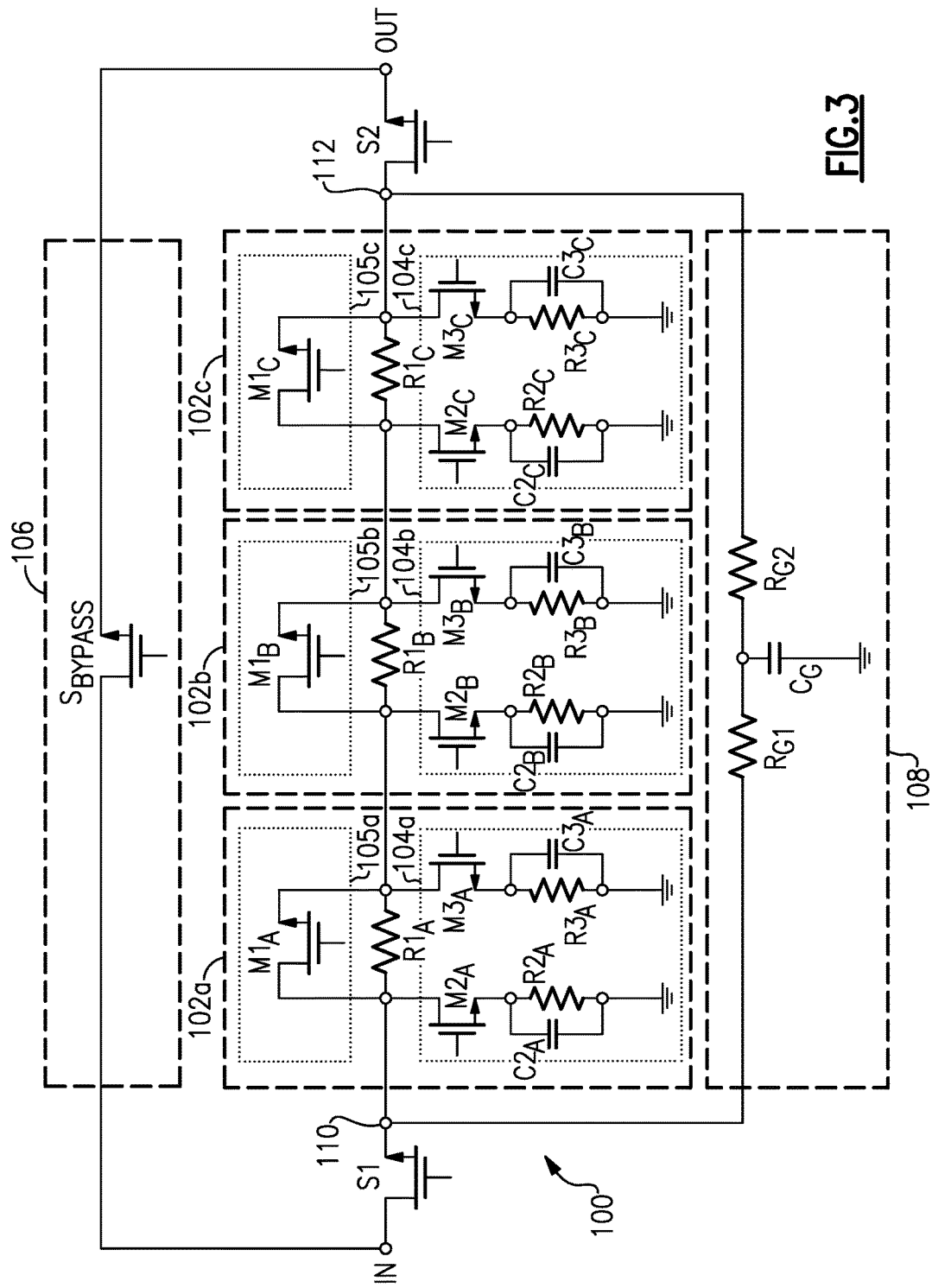
FIG. 3 shows an attenuation circuit that can be a more specific example of the attenuation circuit of FIG. 2.

FIG. 3 shows an attenuation circuit 100 that can be a more specific example of the attenuation circuit 100 of FIG. 2. In the example of FIG. 3, switches S1 and S2 can be implemented as, for example, field-effect transistors (FETs). Accordingly, S1 can be implemented between the input node (IN) and a first node 110, and S2 can be implemented between the output node (OUT) and a second node 112.

In the example of FIG. 3, each of three attenuation blocks 102a, 102b, 102c is shown to include a pi-attenuator configuration and a local bypass path (105a, 105b or 105c). For example, the first attenuation block 102a is shown to include resistances $R1_A$, $R2_A$, $R3_A$ arranged in a pi-configuration. The resistance $R1_A$ is shown to be implemented between input and output nodes of the first attenuation block 102a. The resistance $R2_A$ is shown to be implemented between the input node and ground; similarly, the resistance $R3_A$ is shown to be implemented between the output node and ground.

In the pi-configuration of the first attenuation block 102a of FIG. 3, a switching FET $M2_A$ can be provided between the input node and one end of the resistance $R2_A$, with the other end of the resistance $R2_A$ being coupled to ground. Similarly, a switching FET $M3_A$ can be provided between the output node and one end of the resistance $R3_A$, with the other end of the resistance $R3_A$ being coupled to ground. Such switching FETs ($M2_A$ and $M3_A$) can be turned ON when attenuation is enabled for the first attenuation block 102a, and be turned OFF when attenuation is bypassed through the local bypass path 105a. Such a local bypass path (105a) can include, for example, a switching FET $M1_A$ which can be turned OFF when attenuation is enabled for the first attenuation block 102a, and be turned ON when attenuation is bypassed through the local bypass path 105a.

In the pi-configuration of the first attenuation block 102a of FIG. 3, a capacitance $C2_A$ can be provided so as to be electrically parallel with the resistance $R2_A$. Similarly, a capacitance $C3_A$ can be provided so as to be electrically parallel with the resistance $R3_A$. As described herein, such capacitances can be selected to compensate for phase-shifting that occurs when an RF signal is passed through the attenuation block. As also described herein, such capacitances can also allow the attenuation block to provide a desirably flat gain profile over a relatively wide frequency range.

In the example of FIG. 3, the second attenuation block 102b is shown to include resistances $R1_B$, $R2_B$, $R3_B$ arranged in a pi-configuration. The resistance $R1_B$ is shown to be implemented between input and output nodes of the second attenuation block 102b. The resistance $R2_B$ is shown to be implemented between the input node and ground; similarly, the resistance $R3_B$ is shown to be implemented between the output node and ground.

In the pi-configuration of the second attenuation block 102b of FIG. 3, a switching FET $M2_B$ can be provided between the input node and one end of the resistance $R2_B$, with the other end of the resistance $R2_B$ being coupled to ground. Similarly, a switching FET $M3_B$ can be provided between the output node and one end of the resistance $R3_B$, with the other end of the resistance $R3_B$ being coupled to ground. Such switching FETs ($M2_B$ and $M3_B$) can be turned ON when attenuation is enabled for the second attenuation block 102b, and be turned OFF when attenuation is bypassed through the local bypass path 105b. Such a local bypass path (105b) can include, for example, a switching FET M1$_B$ which can be turned OFF when attenuation is enabled for the second attenuation block 102b, and be turned ON when attenuation is bypassed through the local bypass path 105b.

In the pi-configuration of the second attenuation block 102b of FIG. 3, a capacitance C2$_B$ can be provided so as to be electrically parallel with the resistance R2$_B$. Similarly, a capacitance C3$_B$ can be provided so as to be electrically parallel with the resistance R3$_B$. As described herein, such capacitances can be selected to compensate for phase-shifting that occurs when an RF signal is passed through the attenuation block. As also described herein, such capacitances can also allow the attenuation block to provide a desirably flat gain profile over a relatively wide frequency range.

In the example of FIG. 3, the third attenuation block 102c is shown to include resistances R1$_C$, R2$_C$, R3$_C$ arranged in a pi-configuration. The resistance R1$_C$ is shown to be implemented between input and output nodes of the third attenuation block 102c. The resistance R2$_C$ is shown to be implemented between the input node and ground; similarly, the resistance R3$_C$ is shown to be implemented between the output node and ground.

In the pi-configuration of the third attenuation block 102c of FIG. 3, a switching FET M2$_C$ can be provided between the input node and one end of the resistance R2$_C$, with the other end of the resistance R2$_C$ being coupled to ground. Similarly, a switching FET M3$_C$ can be provided between the output node and one end of the resistance R3$_C$, with the other end of the resistance R3$_C$ being coupled to ground. Such switching FETs (M2$_C$ and M3$_C$) can be turned ON when attenuation is enabled for the third attenuation block 102c, and be turned OFF when attenuation is bypassed through the local bypass path 105c. Such a local bypass path (105c) can include, for example, a switching FET M1$_C$ which can be turned OFF when attenuation is enabled for the third attenuation block 102c, and be turned ON when attenuation is bypassed through the local bypass path 105c.

In the pi-configuration of the third attenuation block 102c of FIG. 3, a capacitance C2$_C$ can be provided so as to be electrically parallel with the resistance R2$_C$. Similarly, a capacitance C3$_C$ can be provided so as to be electrically parallel with the resistance R3$_C$. As described herein, such capacitances can be selected to compensate for phase-shifting that occurs when an RF signal is passed through the attenuation block. As also described herein, such capacitances can also allow the attenuation block to provide a desirably flat gain profile over a relatively wide frequency range.

In each of the attenuation blocks 102a, 102b, 102c, the presence of the capacitances C2 and C3 in parallel with their respective resistances R2 and R3 allows phase compensation as described herein. As also described herein, such phase compensation can also depend on values of the resistances R2 and R3, as well as on-resistance values (Ron) of the switching transistors M2 and M3. Accordingly, it will be understood that a box indicated as 104a, 104b or 104c includes some or all of circuit elements of a respective local phase compensation circuit, or includes some or all of circuit elements that can influence such local phase compensation.

In the example of FIG. 3, a bypass path 106 can be provided between the input node (IN) and the output node (OUT) so as to allow an RF signal to bypass the foregoing attenuation blocks (102a, 102b, 102c). Preferably, such a bypass path also bypasses the switches S1 and S2 to not incur any losses that may be associated with such switches.

In some embodiments, the bypass path 106 can include a switching FET S$_{Bypass}$ implemented to be turned ON when bypassing of the attenuation blocks (102a, 102b, 102c) is desired. In such a state, each of the switches S1 and S2 can be turned OFF. The switching FET S$_{Bypass}$ can be turned OFF when attenuation through one or more of the attenuation blocks is desired. In such a state, each of the switches S1 and S2 can be turned ON.

In the example of FIG. 3, a global phase compensation circuit 108 can be provided to compensate for a phase shift that can result from the foregoing bypass circuit 106. For example, when the switching FET S$_{Bypass}$ is in the OFF state (in the attenuation mode), an off-capacitance value Coff is present; and such Coff can cause a phase shift in the RF signal being attenuated.

In some embodiments, the global phase compensation circuit 108 can include first and second resistances R$_{G1}$ and R$_{G2}$ implemented between the first and second nodes 110, 112. Further, a capacitance C$_G$ can be provided between ground and a node between R$_{G1}$ and R$_{G2}$. Examples of how such resistance values and capacitance value can be selected to provide desirable phase compensation are described herein in greater detail.

In the example of FIG. 3, some or all of the various switching FETs can be implemented as, for example, silicon-on-insulator (SOI) devices. It will be understood that while such various switching FETs are depicted as being NFETs, one or more features of the present disclosure can also be implemented utilizing other types of FETs. It will also be understood that the various switches in the example of FIG. 3 can also be implemented as other types of transistors, including non-FET transistors.

Figure 4:
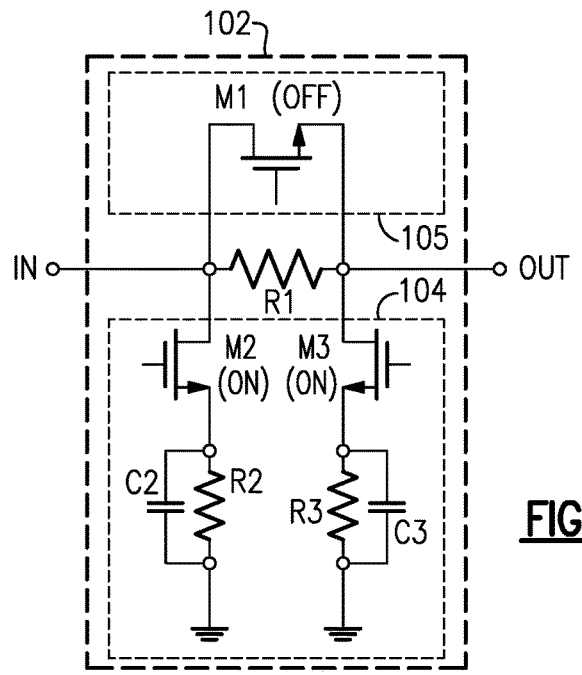
FIG. 4 shows an individual local attenuation block that can represent each of the three example attenuation blocks of FIG. 3.
Figure 5:
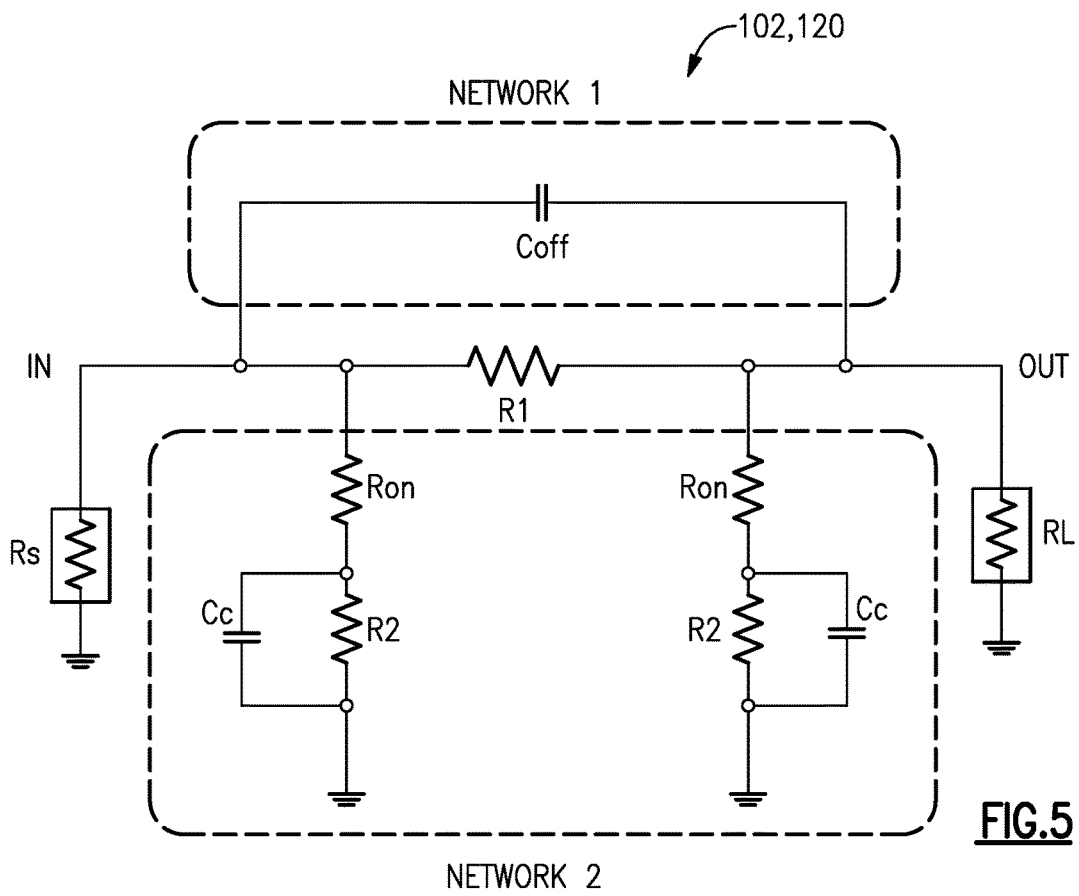
FIG. 5 shows a circuit representation of the example attenuation block of FIG. 4, in which the various switching transistors are represented as either off-capacitance(s) or on-resistance(s).
Figure 6:
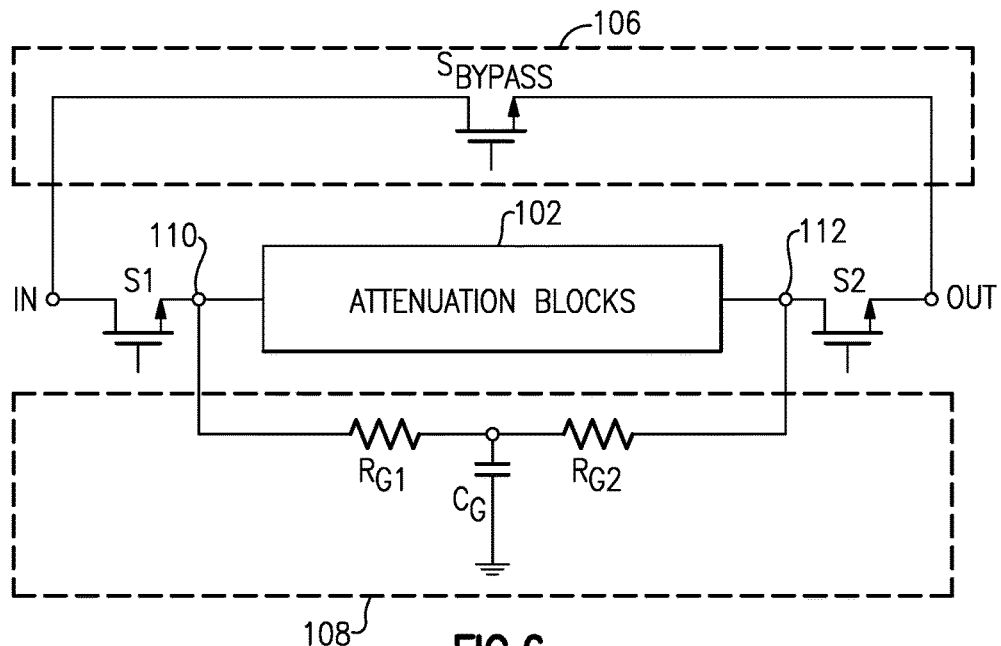
FIG. 6 shows an attenuation circuit similar to the example of FIG. 3, but with the local attenuation blocks collectively depicted together.
Figure 7:
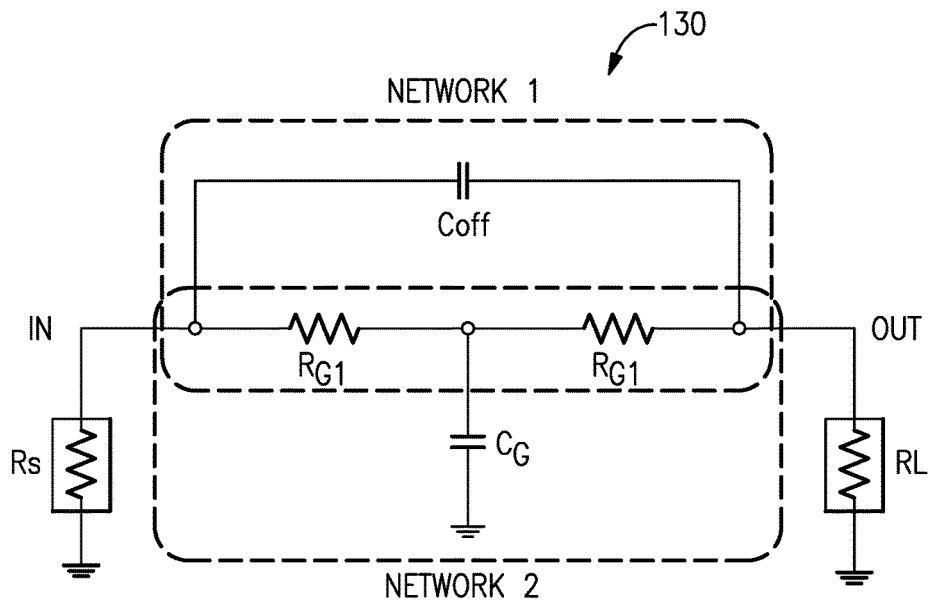
FIG. 7 shows a circuit representation of the global bypass path and the global phase compensation circuit of FIG. 6.

FIGS. 4 and 5 show an example of how phase compensation can be implemented for a given local attenuation block 102. FIGS. 6 and 7 show an example of how global phase compensation can be implemented.

FIG. 4 shows an individual local attenuation block 102, and such an attenuation block can represent each of the three example attenuation blocks 102a, 102b, 102c of FIG. 3. Accordingly, reference numerals of the various elements of the attenuation block 102 are shown without subscripts.

In the example of FIG. 4, the local attenuation block 102 is in its attenuation mode, such that an RF signal received at the local input node (IN) is attenuated and provided at the local output node (OUT). Accordingly, the local bypass switching FET M1 of the local bypass path 105 is OFF, and each of the switching FETs M2 and M3 of the circuit 104 is ON.

FIG. 5 shows a circuit representation 120 of the example attenuation block 102 of FIG. 4, in which the various switching FETs are represented as either off-capacitance(s) or on-resistance(s). For example, the OFF state of M1 is represented as an off-capacitance Coff, and the ON state of each of M2 and M3 is represented as an on-resistance Ron. For the purpose of description, it is assumed that the pi-attenuator configuration of FIG. 4 is generally symmetric. Accordingly, M2 can be similar to M3, such that Ron of M2 is approximately the same as Ron of M3; hence, FIG. 5 depicts each of M2 and M3 as Ron. Similarly, the resistances R2 and R3 in FIG. 4 are assumed to be approximately the same; hence, FIG. 5 depicts each of R2 and R3 as having a resistance R2. Similarly, the capacitances C2 and C3 in FIG. 4 are assumed to be approximately the same; hence, FIG. 5 depicts each of C2 and C3 as having a compensation capacitance of Cc.

In FIG. 5, the circuit representation 120 is shown to have a source impedance Rs at the local input (IN), and a load impedance RL at the local output (OUT). Such impedance values may or may not be the same. For the purpose of description, however, values of Rs and RL are assumed to be the same at a characteristic impedance Z0 (e.g., at 50Ω).

With the foregoing assumption, values of R1 and R2 in the example of FIG. 5 can be obtained as follows:

$$R_1 = \frac{z_0}{2} \cdot \frac{K-1}{K+1} \quad (1)$$

$$R_2 = Z_0 \cdot \frac{K+1}{K-1}. \quad (2)$$

In Equations 1 and 2, the parameter K represents the attenuation value of the attenuation block 120. It is noted that as attenuation becomes larger, R1 generally increases, and R2 generally decreases.

Referring to FIG. 5, and assuming that the on-resistance Ron of each of M2 and M3 is approximately zero, a portion of the attenuation block 120, indicated as Network 1, can contribute to forward gain and phase shift (e.g., phase lead) of the attenuation block 120 as:

$$\frac{V_{out}}{V_{in}} = \frac{R_L(1 + sR_1 C_{off})}{(R_L + R_1) + sR_L R_1 C_{off}} \quad (3)$$

$$\phi = \tan^{-1}(\omega R_1 C_{off}) - \tan^{-1}\left(\omega\left(\frac{R_1 R_L}{R_1 + R_L}\right)C_{off}\right). \quad (4)$$

In FIG. 5, a portion of the attenuation block 120, indicated as Network 2, can contribute to forward gain and phase shift (e.g., phase lag) of the attenuation block 120 as:

$$\frac{V_{out}}{V_{in}} = \frac{R_2'}{(R_2' + R_1) + sR_2' R_1 C_c} \quad (5)$$

$$\phi = -\tan^{-1}\left(\frac{\omega R_1 R_2' C_c}{R_1 + R_2'}\right). \quad (6)$$

In Equations 3-6, ω=2πf, where f is frequency, and $R_2'$ is a resistance value of parallel arrangement of $R_2$ and $R_L$.

Referring to FIGS. 4 and 5, and Equations 4 and 6, it is noted that the parameters ω, $R_L$, $C_{off}$, $R_1$ and $R_2$ are typically set for a given frequency, characteristic impedance, switching FET configuration, and attenuation value. However, in some embodiments, the value of the compensation capacitance Cc can be adjusted such that the phase lag of Equation 6 compensates for the phase lead of Equation 4. Such phase compensation can allow the phase associated with the attenuation block 102/120 of FIGS. 4 and 5 to be at or near a desired value. For example, the compensated phase associated with the attenuation block 102/120 can have substantially the same phase variation as in a reference mode.

Referring to FIGS. 4 and 5, it is noted that since Coff is in parallel arrangement with R1, its impedance $1/(j\omega C_{off})$ will make an equivalent series impedance between the input and output nodes become smaller as frequency increases, resulting in less attenuation at a higher frequency. Inversely, higher attenuation can result at a lower frequency.

It is further noted that the compensation capacitance Cc is arranged parallel to the corresponding shunt resistance R2. Thus, the impedance $(1/(j\omega C_C))$ of the compensation capacitance Cc will make an equivalent impedance of the shunt arm become less, resulting in more attenuation for the attenuation block. Thus, in some embodiments, the compensation capacitance Cc can be selected to compensate for the impact of Coff on gain, and thereby achieve a desired gain profile (e.g., approximately flat profile) for the attenuation block over a wide frequency range. In some embodiments, the compensation capacitance Cc can be selected to provide at least some phase compensation described herein, as well as to provide at least some gain compensation as described herein, for the attenuation block.

FIG. 6 shows an attenuation circuit similar to the example of FIG. 3, but with the local attenuation blocks collectively indicated as 102 for simplicity. The bypass path 106 and the global phase compensation circuit 108 are substantially the same as in the example of FIG. 3.

In the example of FIG. 6, the attenuation circuit can be in its attenuation mode, such that an RF signal received at the global input node (IN) is attenuated and provided at the global output node (OUT). In such an attenuation mode, the global bypass switching FET $S_{Bypass}$ of the bypass path 106 can be OFF to provide a global off-capacitance of Coff.

FIG. 7 shows a circuit representation 130 of the global bypass path 106 and the global phase compensation circuit 108 of FIG. 6. For the purpose of description, it is assumed that the resistances $R_{G1}$ and $R_{G2}$ of the global phase compensation circuit 108 are substantially the same.

In FIG. 7, the circuit representation 130 is shown to have a source impedance Rs at the global input (IN), and a load impedance RL at the global output (OUT). Such impedance values may or may not be the same. For the purpose of description, however, values of Rs and RL are assumed to be the same at a characteristic impedance Z0 (e.g., at 50Ω). Further, the resistance $R_{G1}$ (and thus $R_{G2}$ in the foregoing assumption) is also assumed to have a value of 50Ω.

With the foregoing assumptions, a portion of the circuit 130, indicated as Network 1, can contribute to forward gain and phase shift (e.g., phase lead) of the circuit 130 as:

$$\frac{V_{out}}{V_{in}} = \frac{1 + 2sR_{G1} C_{off}}{3 + 2sR_{G1} C_{off}} \quad (7)$$

$$\phi = \tan^{-1}(2\omega R_{G1} C_{off}) - \tan^{-1}\left(\frac{2}{3}\omega R_{G1} C_{off}\right). \quad (8)$$

In FIG. 7, a portion of the circuit 130, indicated as Network 2, can contribute to forward gain and phase shift (e.g., phase lag) of the circuit 130 as:

$$\frac{V_{out}}{V_{in}} = \frac{1}{3 + 2sR_{G1} C_G} \quad (9)$$

$$\phi = \tan^{-1}\left(\frac{2}{3}\omega R_{G1} C_G\right). \quad (10)$$

Referring to FIGS. 6 and 7, and Equations 8 and 10, it is noted that the parameters ω, $R_L$ and $C_{off}$ are typically set for a given frequency, characteristic impedance, and global bypass switch FET ($S_{Bypass}$) configuration. However, in some embodiments, either or both of the values of the global compensation resistance $R_{G1}$ and compensation capacitance $C_G$ can be adjusted such that the phase lag of Equation 10 compensates for the phase lead of Equation 8. Such phase compensation can allow the phase associated with the circuit 130 of FIGS. 6 and 7 to be at or near a desired value.

Referring to FIGS. 6 and 7, it is noted that since Coff is in parallel arrangement with $2R_{G1}$, its impedance $1/(j\omega C_{off})$ will make an equivalent series impedance between the input and output nodes become smaller as frequency increases, resulting in less attenuation at a higher frequency. Inversely, higher attenuation can result at a lower frequency.

It is further noted that the global compensation capacitance $C_G$ is by itself as a shunt capacitance. Thus, the impedance $(1/(j\omega C_G))$ of the global compensation capacitance $C_G$ will make an equivalent impedance of the shunt arm become less, resulting in more attenuation for the global attenuation circuit. Thus, in some embodiments, the global compensation capacitance $C_G$ can be selected to compensate for the impact of Coff on gain, and thereby achieve a desired gain profile (e.g., approximately flat profile) for the global attenuation circuit over a wide frequency range. In some embodiments, the global compensation capacitance $C_G$ can be selected to provide at least some phase compensation described herein, as well as to provide at least some gain compensation as described herein, for the global attenuation circuit.

Figure 8:
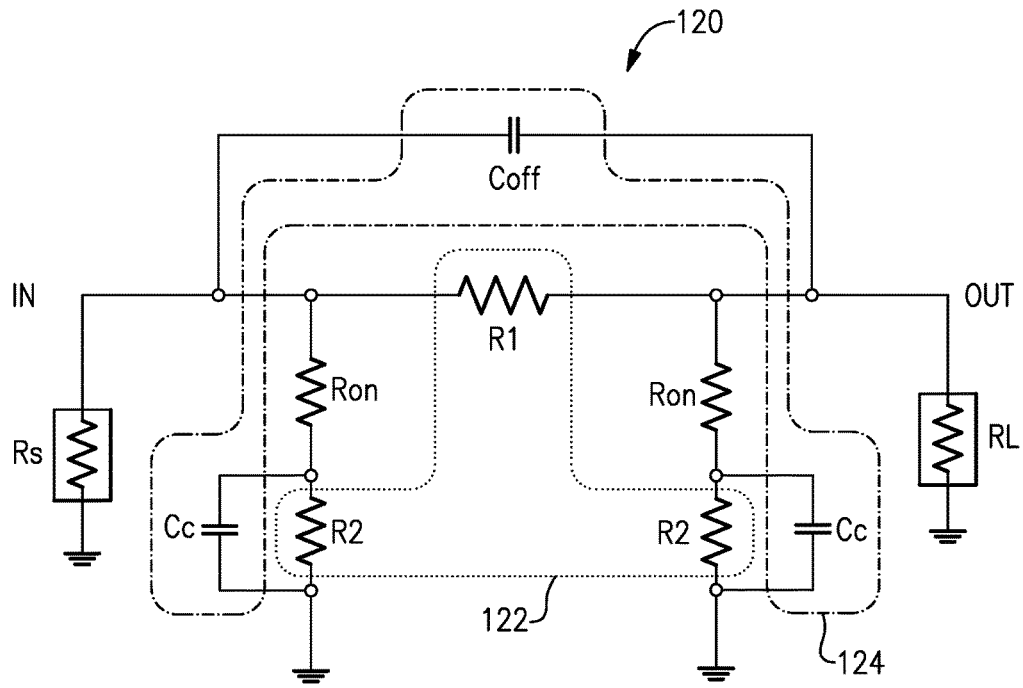
FIG. 8 shows a circuit representation that is similar to the circuit representation of FIG. 5.

In some embodiments, a phase compensation circuit having one or more features as described herein can be configured to account for process variations. By way of an example, FIG. 8 shows a circuit representation 120 that is similar to the circuit representation 120 of FIG. 5 (which corresponds to the example attenuation block 102 of FIG. 4). As described herein, the off-capacitance (Coff) of the bypass capacitance results in a phase change that can be compensated by the compensation capacitances Cc. The off-capacitance (Coff) in the example of FIG. 8 results from the OFF state of a bypass switch transistor which can suffer from process variation (e.g., among a number of such devices fabricated together on a wafer). Thus, one or more electrical properties, including Coff, of the bypass switch transistor can vary due to such process variation. Accordingly, the phase change due to such Coff (e.g., as in Equations 4 or 8) can also vary.

FIG. 8 shows that such process variation and related effects in Coff can be accounted for in the phase compensation circuit. For example, the compensation capacitances Cc in the shunt arms can be configured to be affected by process variation similar to that of the bypass switch transistor (Coff). In some embodiments, such compensation capacitances Cc can be configured as a transistor or transistor-like device, such that any process variation affecting the bypass switch transistor (Coff) also affects the compensation capacitances Cc. For example, if the bypass switch transistor having a Coff property is implemented as a MOSFET device, each of the compensation capacitances Cc can be implemented as a MOSFET or MOSFET-like device. Accordingly, any process-related variation in the bypass switch MOSFET also affects the MOSFET devices of the compensation capacitances Cc, thereby substantially removing or reducing the dependence of the compensation capacitances Cc on process variation (e.g., on the process variation manifested in the bypass switch MOSFET).

In FIG. 8, the foregoing common process variation among the bypass switch MOSFET (Coff) and the MOSFET devices is collectively depicted as 124. Such common process variation among various resistances can also be implemented. For example, resistances R1, R2 (collectively depicted as 122) can be implemented as same type of resistors subject to same process variations.

In the example of FIG. 8, the circuit representation 120 and related process variations are described in the context of an individual attenuation block and its bypass path. It will be understood that such phase compensation generally independent of process variation can also be implemented in the global bypass path and the corresponding global phase compensation circuit.

Figure 9:
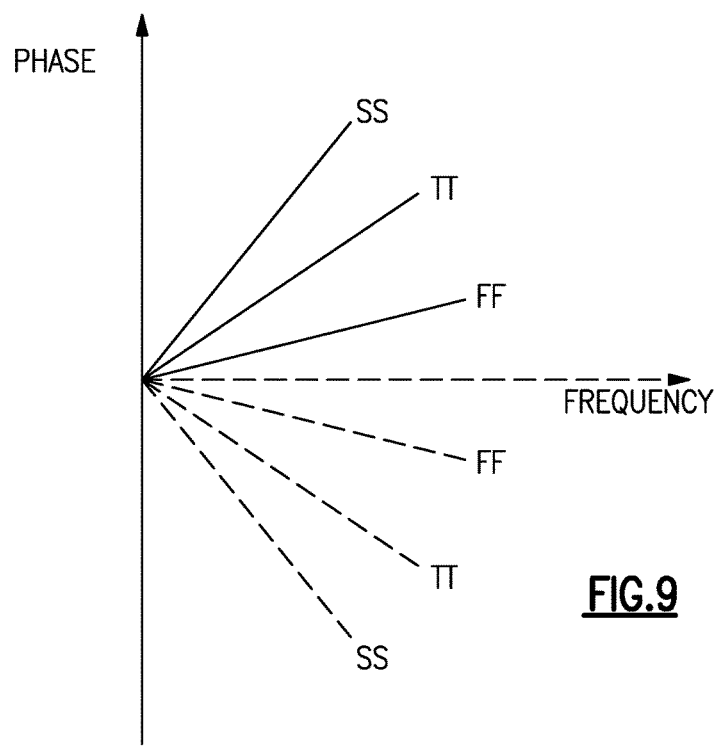
FIG. 9 shows an example of how process variation can impact phase changes in an attenuator circuit, and how such phase changes can be compensated.

FIG. 9 shows an example of how process variation can impact phase changes in an attenuator circuit, and how such phase changes can be compensated. In FIG. 9, phase-lead (e.g., as in Equation 4) as a function of frequency is depicted for three different example RC values resulting from three different process corners FF, TT, SS.

As described herein, such phase-lead typically depends on some combination of resistance and capacitance (e.g., RC). Thus, and as described in reference to FIG. 8, removing or reducing process dependence of capacitances and resistances among a given bypass circuit and the corresponding phase compensation circuit can allow the resulting phase compensation to be more effective. In the example of FIG. 9, the removal or reduction of process dependence can allow the resulting phase compensation in the form of phase lag (dashed lines) being more symmetric with the corresponding phase lead, relative to the frequency axis. In some embodiments, a given phase lead due to the bypass path and the resulting phase lag due to the compensation circuit can be substantially symmetric, such that the net phase change is approximately zero for a range of frequency. For example, the FF phase lead and the FF phase lag can be substantially symmetric about the frequency axis, such that the net phase change in a given attenuation block is approximately zero for a range of frequency. In another example, the TT phase lead (which is different than the FF phase lead due to process variation) can be compensated by the TT phase lag to provide a substantially zero phase change over a range of frequency.

Figure 10:
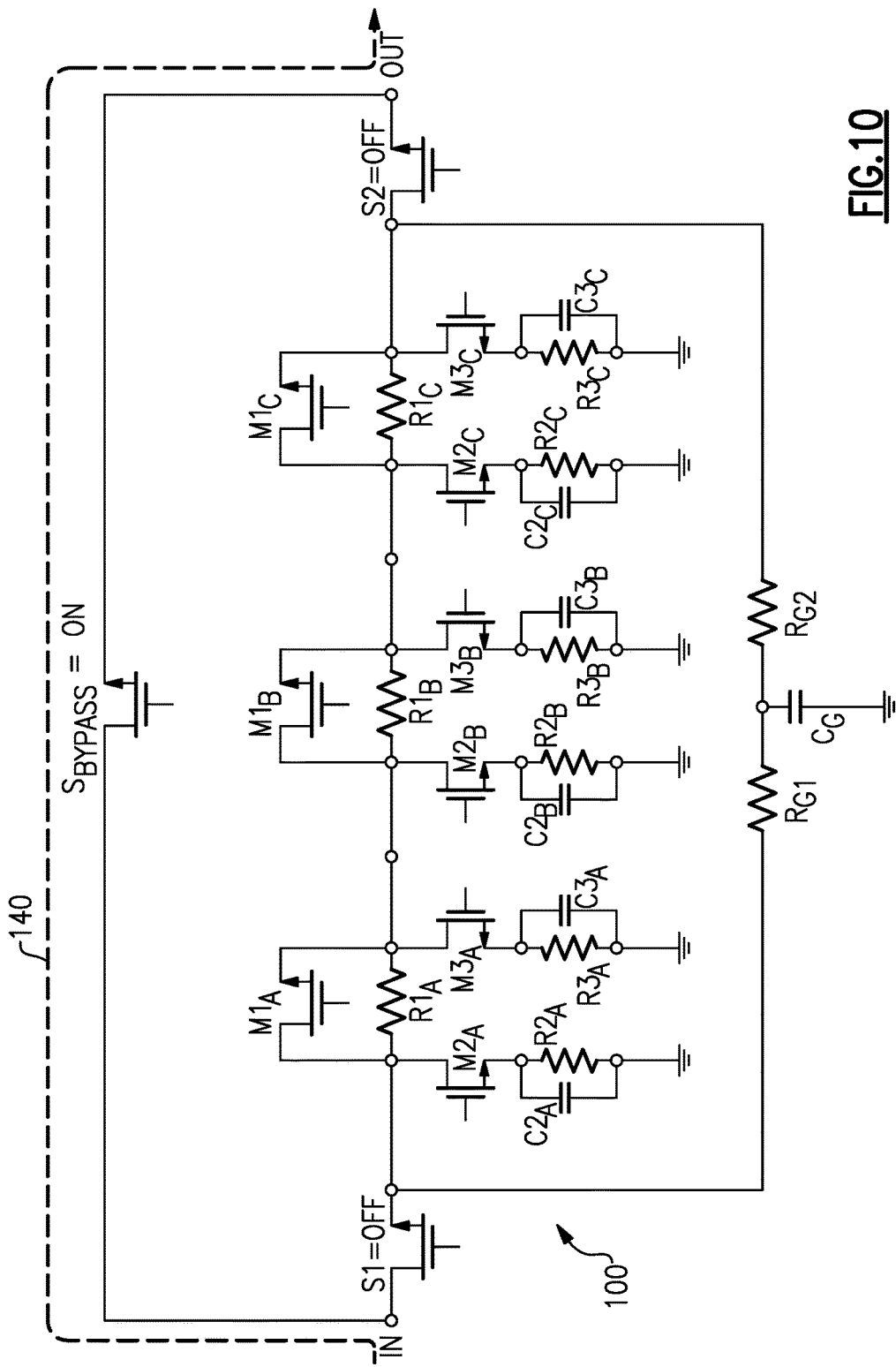
FIG. 10 shows an example of a global bypass operating mode for the attenuation circuit of FIG. 3.
Figure 11:
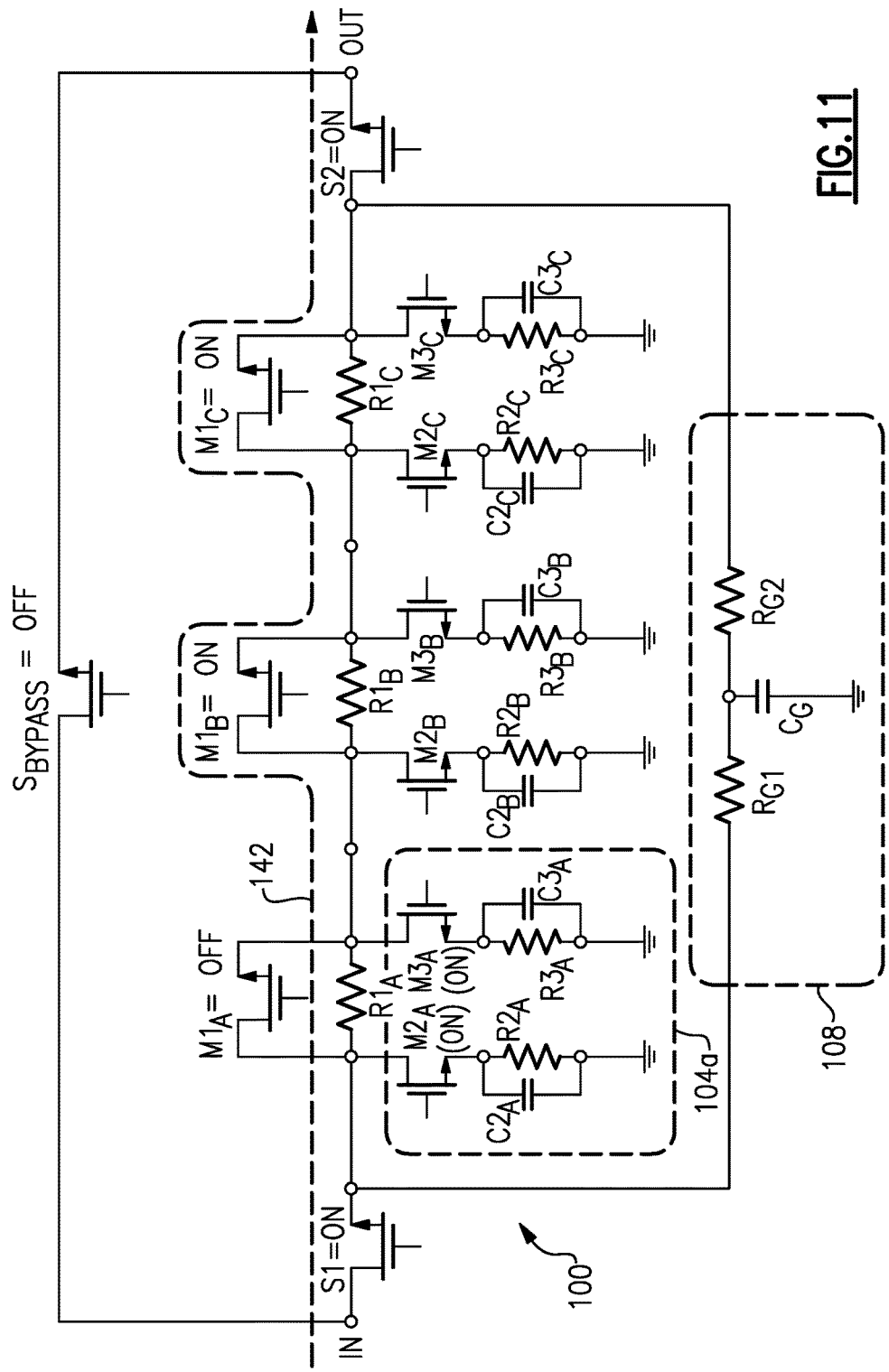
FIG. 11 shows an example of an attenuation operating mode for the attenuation circuit of FIG. 3, in which attenuation is being provided by the first attenuation block, and each of the second and third attenuation blocks is being bypassed.
Figure 12:
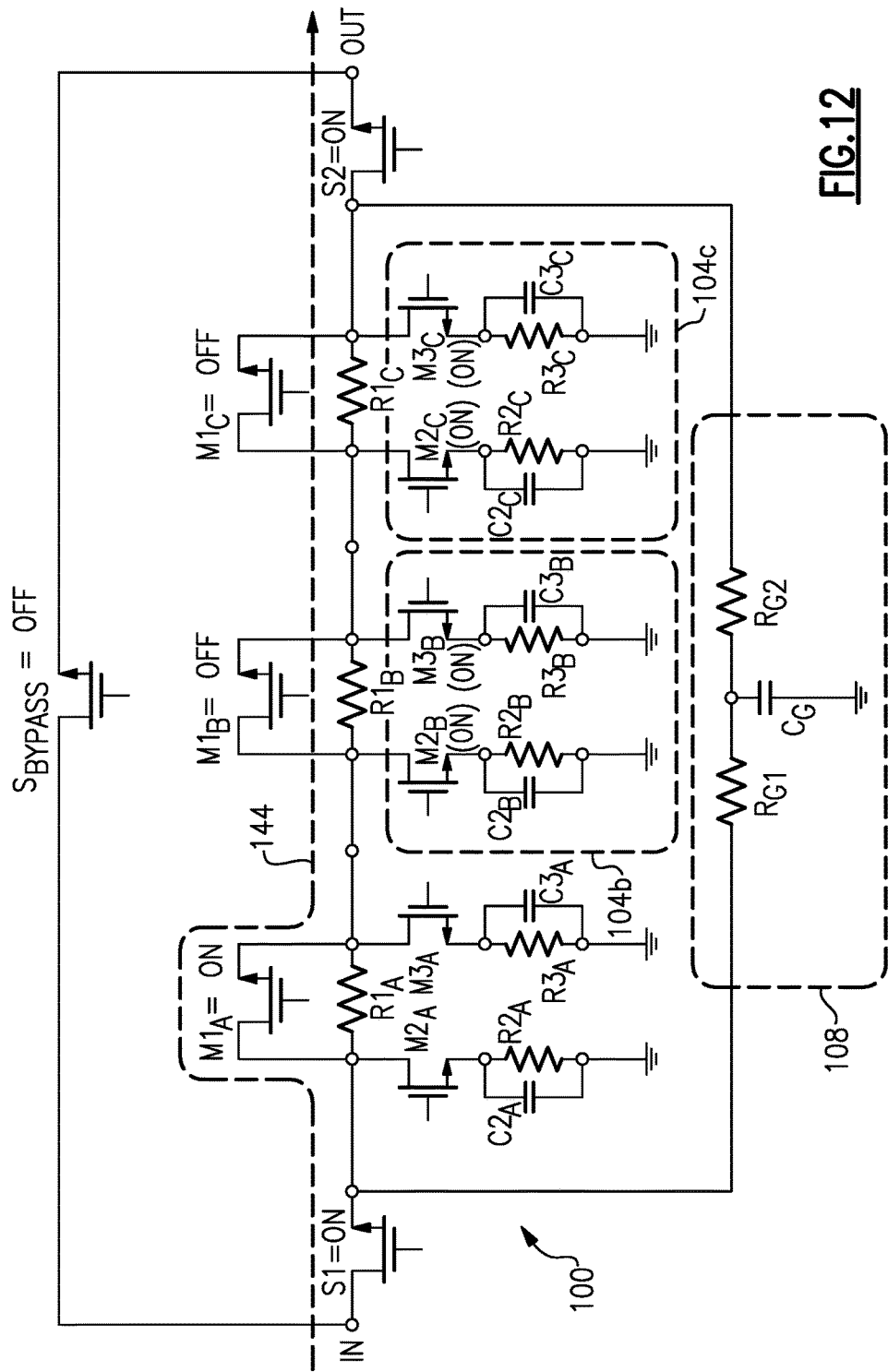
FIG. 12 shows another example of an attenuation operating mode for the attenuation circuit of FIG. 3, in which attenuation is being provided by the second and third attenuation blocks, and the first attenuation block is being bypassed.

FIGS. 10-12 show examples of different operating modes that can be implemented for the attenuation circuit 100 of FIG. 3. In FIG. 10, the attenuation circuit 100 is shown to be in a global bypass mode, in which the global bypass switch $S_{Bypass}$ is ON, and each of the switches S1 and S2 is OFF. Accordingly, an RF signal is shown to be routed as indicated by path 140. In such a mode, the RF signal is generally not subjected to a Coff capacitance; thus, undesirable phase shifting generally does not occur.

In FIG. 11, the attenuation circuit 100 is shown to be in an attenuation mode in which A dB attenuation is being provided by the first attenuation block, and each of the second and third attenuation blocks is being bypassed. Accordingly, the global bypass switch FET $S_{Bypass}$ is OFF, and each of the switches S1 and S2 is ON. Further, the first local bypass switch FET $M_{1A}$ is OFF, and each of the shunt arm switch FETs $M_{2A}$, $M_{3A}$ is ON, while each of the second and third local bypass switch FETs $M_{1B}$, $M_{1C}$ is ON.

In such a mode, the global bypass switch FET $S_{Bypass}$ presents a global Coff, and the resulting global phase shift can be compensated as described herein by the global phase compensation circuit 108. At the local level, the first local bypass switch FET $M_{1A}$ presents a local Coff, and the resulting local phase shift can be compensated as described herein by the local phase compensation circuit generally indicated as 104a.

In FIG. 12, the attenuation circuit 100 is shown to be in an attenuation mode in which B+C dB attenuation is being provided by the second and third attenuation blocks, and the first attenuation block is being bypassed. Accordingly, the global bypass switch FET $S_{Bypass}$ is OFF, and each of the switches S1 and S2 is ON. Further, each of the second and third local bypass switch FETs $M_{1B}$, $M_{1C}$ is OFF, and each of the shunt arm switch FETs $M_{2B}$, $M_{3B}$, $M_{2C}$, $M_{3C}$ is ON, while the first local bypass switch FET $M_{1A}$ is ON.

In such a mode, the global bypass switch FET $S_{Bypass}$ presents a global Coff, and the resulting global phase shift can be compensated as described herein by the global phase compensation circuit 108. At the local level, each of the first and second local bypass switch FETs $M_{1B}$, $M_{1C}$ presents a respective local Coff, and the resulting local phase shift can be compensated as described herein by the respective local phase compensation circuit generally indicated as 104b or 104c.

Figure 13:
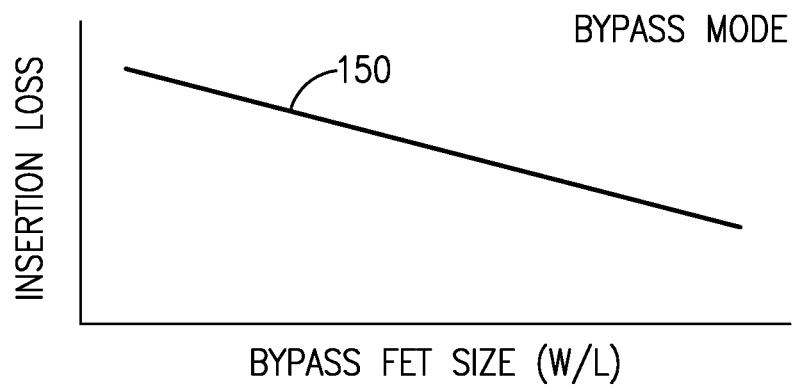
FIG. 13 shows that in some embodiments, the global bypass switch transistor can have width and length dimensions, and for a given length, insertion loss at the global bypass switch transistor (when ON) generally decreases when the quantity width increases.

FIGS. 13-16 show examples of how a global bypass switch FET ($S_{Bypass}$) as described herein (e.g., FIGS. 3 and 10-12) can be configured to provide desired performance when in the global bypass mode and when in the attenuation mode. For example, FIG. 13 shows that in some embodiments, the global bypass switch FET ($S_{Bypass}$) can have width (W) and length (L) dimensions, and for a given L, insertion loss at the global bypass switch FET (when ON) generally decreases when the quantity W/L increases (as shown by a plot 150). Thus, if low insertion loss is desired during the global bypass mode, the global bypass switch FET can be relatively large. For example, in some embodiments, a width W of the global bypass switch FET can be as large as about 1 to 2 mm.

In some embodiments, the global bypass switch FET can be a relatively large device, and thus can provide a relatively large parasitic capacitance when in the OFF state (e.g., in the attenuation mode). Such a parasitic capacitance can cause some undesirable effects if not compensated.

Figure 14:
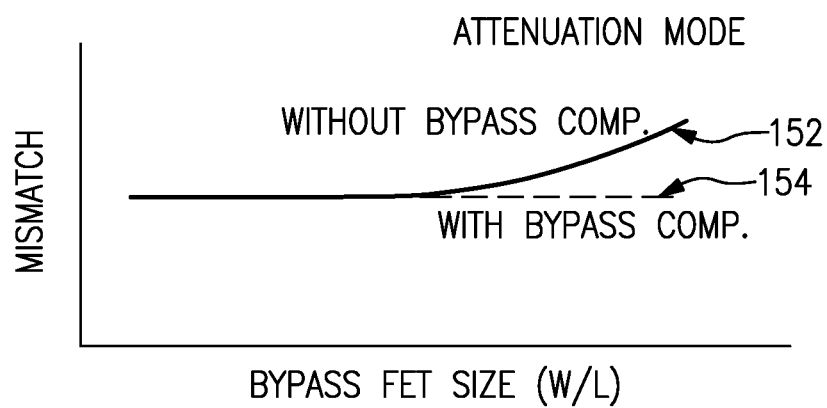
FIG. 14 shows that a mismatch level of the attenuation circuit can vary significantly from some uniform level when the size of the global bypass switch transistor increases.

For example, FIG. 14 shows that a mismatch level of the attenuation circuit (e.g., 100 in FIG. 3) can vary significantly from some uniform level when the size (e.g., W/L, for a given L) of the global bypass switch FET increases. In the example of FIG. 14, such a deviation from the uniform level is depicted by a curve 152.

As described herein, use of a bypass compensation capacitance $C_G$ (e.g., in FIG. 3) can also provide a more uniform mismatch level, as shown by a curve 154. Such a compensation for mismatch is shown to be more significant as the global bypass switch FET gets larger.

Based on the examples of FIGS. 13 and 14, one can see that in an attenuation circuit having one or more features as described herein, a bypass switch FET such as the global bypass switch FET can be implemented to be relatively large to reduce insertion loss. With use of such a large FET, any increased mismatch level can be compensated by a phase compensation circuit such as the global phase compensation circuit.

As described herein, an attenuation circuit such as the example of FIG. 3 can provide compensation for phase variation, as well as for gain variation. In some embodiments, such a gain variation can be at least in part due to a parasitic capacitance of the global bypass switch FET ($S_{Bypass}$). Viewed another way, an attenuation level provided by the attenuation circuit (when in the attenuation mode) can vary from a desired level as the size (e.g., W/L, for a given L) varies.

Figure 15:
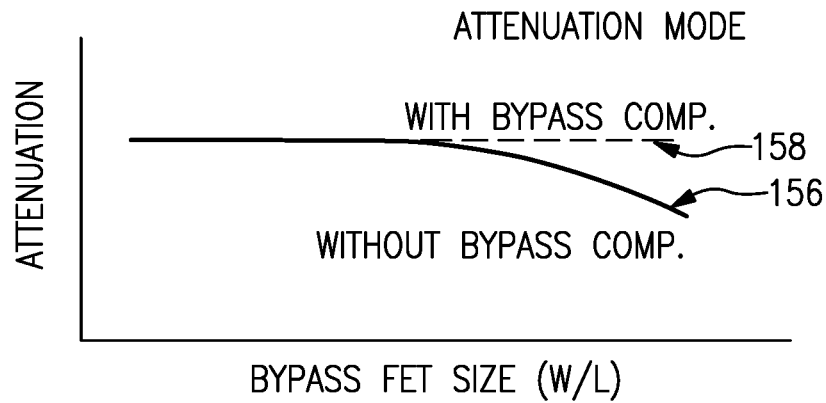
FIG. 15 shows a plot of an attenuation level that decreases from a desired level, as the transistor size increases.

For example, FIG. 15 shows a plot 156 of an attenuation level that decreases from a desired level, as the FET size (W/L) increases. Such an effect typically occurs when an attenuation circuit is operating without global bypass compensation. When an attenuation circuit includes a global bypass compensation circuit as described herein, attenuation provided by the attenuation circuit remains significantly more uniform (as depicted by a plot 158) as the FET size (W/L) increases.

Figure 16:
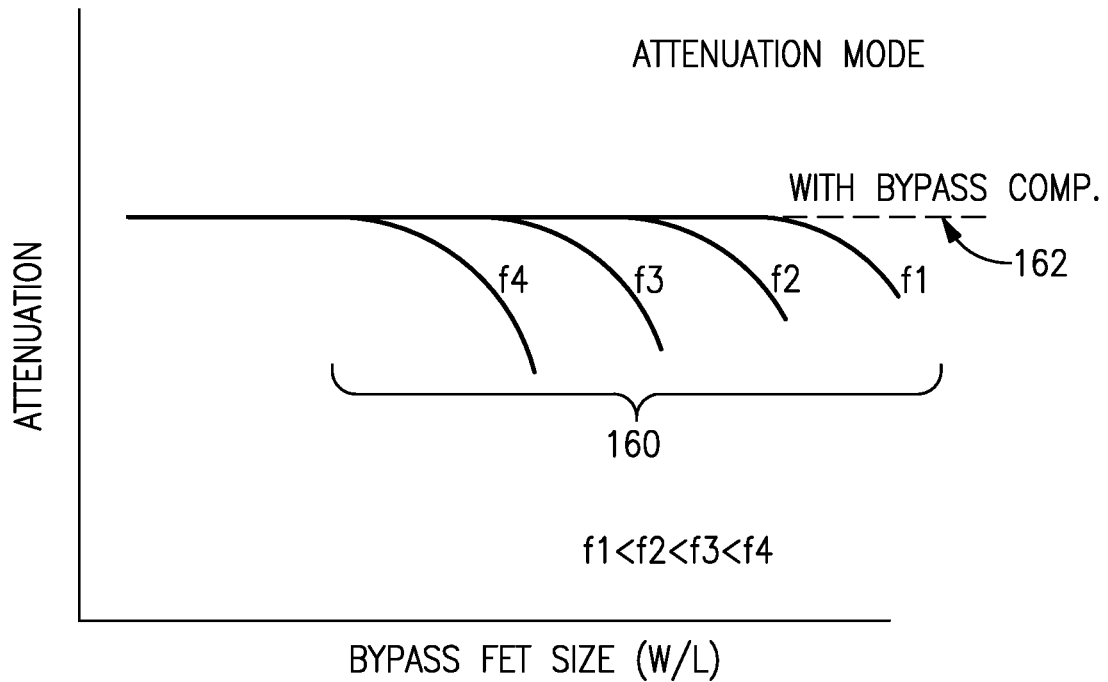
FIG. 16 shows that in some embodiments, an attenuation level can decrease from a desired level sooner as the transistor size is increased, for a higher frequency.

It is noted that since the foregoing attenuation effect is at least in part due to the off-state capacitance of the global bypass switch FET, such an attenuation effect can also vary with frequency of a signal being attenuated. FIG. 16 shows that in some embodiments, an attenuation level can decrease from a desired level sooner as the FET size is increased, for a higher frequency. Suppose that operating frequencies f1, f2, f3 and f4 have values such that f1<f2<f3<f4. In such a situation, and as indicated as 160, the largest frequency (f4) signal will have its attenuation begin to deviate first as the FET size is increased. The next largest frequency (f3) will begin to deviate next as the FET size is increased. The third largest frequency (f2) followed by the smallest frequency (f1) will begin to deviate similarly as the FET size is increased.

Thus, in some embodiments, and as shown in the example of FIG. 16, an attenuation level can remain significantly more uniform for a wide range of operating frequencies, when an attenuation circuit operates with a global bypass compensation circuit as described herein. Such an approximately uniform attenuation level over a range of frequencies and a range of FET sizes is depicted as a plot 162.

Figure 17A:
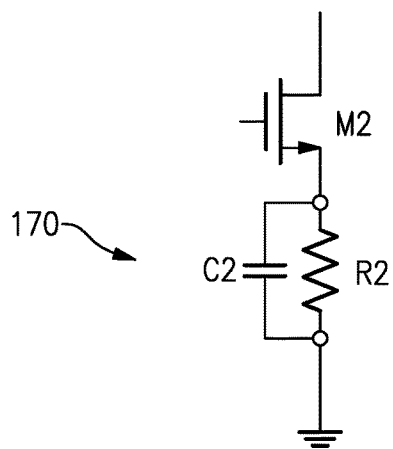
FIG. 17A shows a local compensation path that includes a local compensation capacitance.

As described herein, a local compensation circuit (e.g., 104a, 104b, 104c in FIG. 3) can include a local compensation capacitance (e.g., $C2_A$, $C3_A$, $C2_B$, $C3_B$, $C2_C$, $C3_C$ in FIG. 3, and Cc in FIG. 8). FIG. 17A shows a local compensation path 170 that includes such a local compensation capacitance (indicated as C2). Such a local compensation path is also shown to have a resistance R2 in parallel with C2.

Figure 17B:
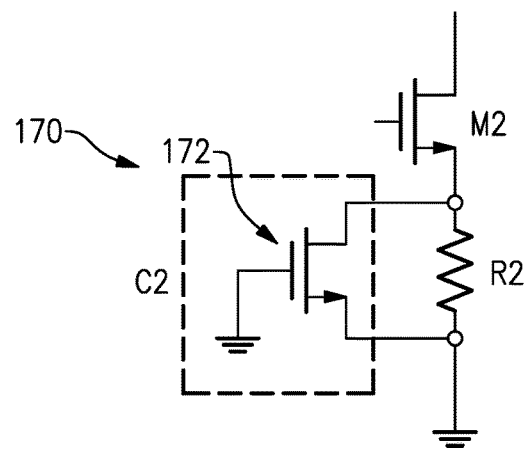
FIG. 17B shows that in some embodiments, the capacitance of FIG. 17A can be implemented as a transistor device configured to provide a desired capacitance value.

FIG. 17B shows that in some embodiments, the capacitance C2 of FIG. 17A can be implemented as a FET device 172 (e.g., as a MOSFET device) configured to provide a desired capacitance value of C2. For example, source and drain of the FET device 172 can be connected to the two ends of the resistance R2, and a gate of the FET device 172 can be grounded without a gate bias, such that the FET device 172 acts as a capacitance similar to that of C2 of FIG. 17A.

When the local compensation capacitance is implemented as in the example of FIG. 17B, a number of desirable features can be achieved. For example, the local compensation capacitance elements can be fabricated essentially together with the various FETs (e.g., local bypass FETs $M1_A$, $M1_B$, $M1_C$ in FIG. 3). In another example, and assuming the foregoing fabrication process commonality, the FET devices 172 acting as capacitances are affected by essentially the same process variations that affect the other FETS (including the local bypass FETs $M1_A$, $M1_B$, $M1_C$). Accordingly, process independence can be achieved among, for example, the FET devices 172 and the other FETs.

Figure 18:
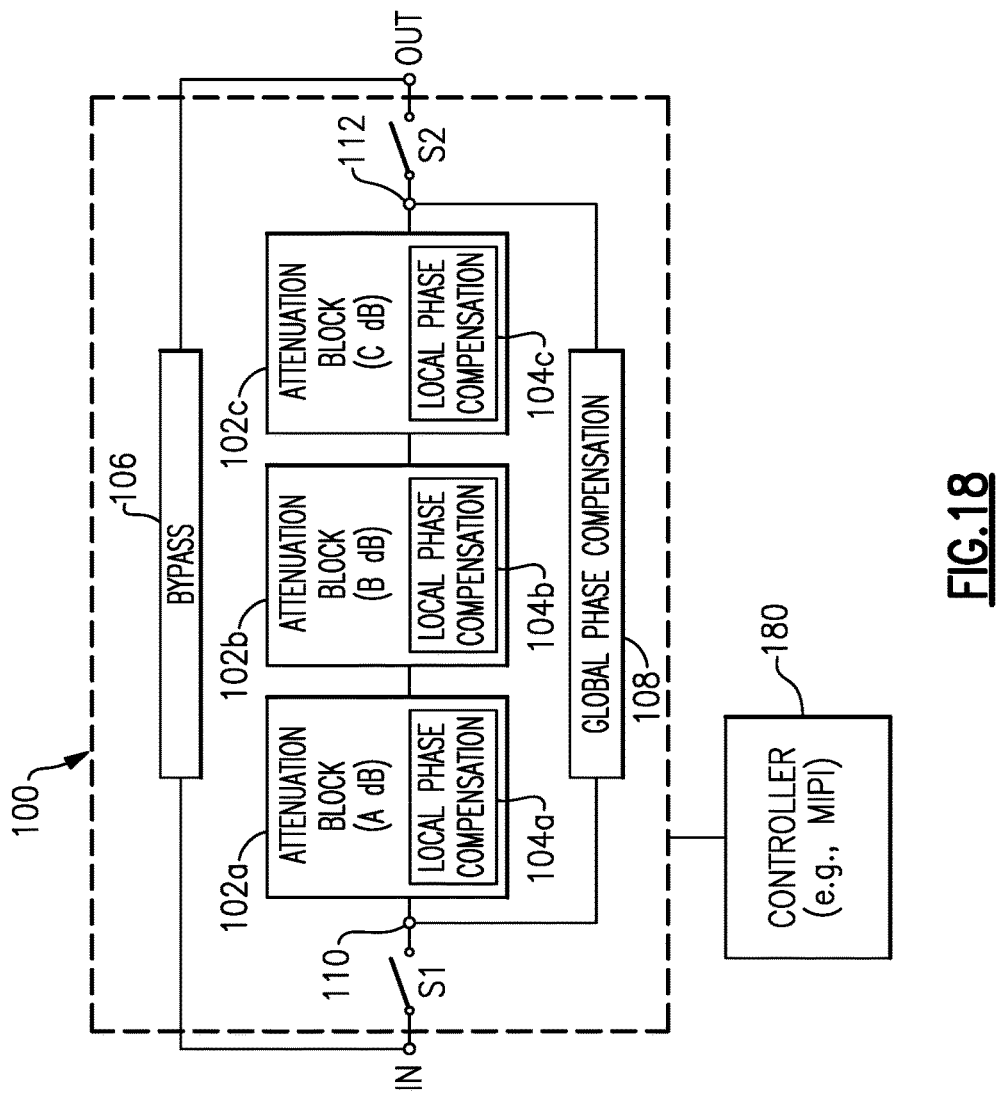
FIG. 18 shows that in some embodiments, an attenuation circuit having one or more features as described herein can be controlled by a controller.

FIG. 18 shows that in some embodiments, an attenuation circuit 100 (e.g., such as the attenuation circuit 100 of FIG. 2) having one or more features as described herein can be controlled by a controller 180. Such a controller can provide various control signals to, for example, operate the various switches to achieve a bypass mode (e.g., as in FIG. 10), or to provide various attenuation modes (e.g., as in FIGS. 11 and 12). In some embodiments, the controller 180 can be configured to include MIPI (Mobile Industry Processor Interface) functionality.

Figure 19:
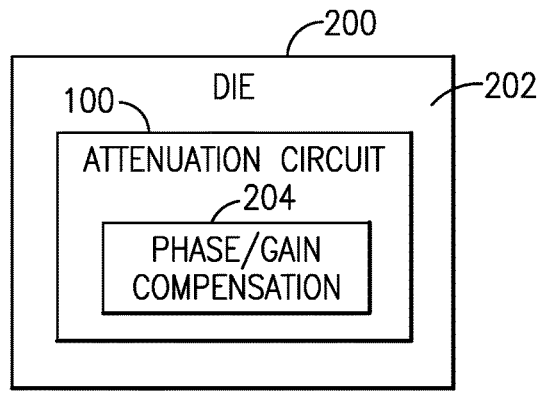
FIG. 19 shows that in some embodiments, some or all of an attenuation circuit having one or more features as described herein can be implemented on a semiconductor die.

FIG. 19 shows that in some embodiments, some or all of an attenuation circuit 100 having one or more features as described herein can be implemented on a semiconductor die 200. Such a die can include a substrate 202, and at least some of a phase/gain compensation circuit 204 (e.g., either or both of global phase compensation circuit 108 and local phase compensation circuits 104a, 104b, 104c of FIG. 3) can be implemented on the substrate 202. For example, some or all of global compensation capacitance $C_G$ and local compensation capacitances $C_{2A}$, $C_{3A}$, $C_{2B}$, $C_{3B}$, $C_{2C}$, $C_{3C}$ can be implemented as on-die capacitors.

Figure 20:
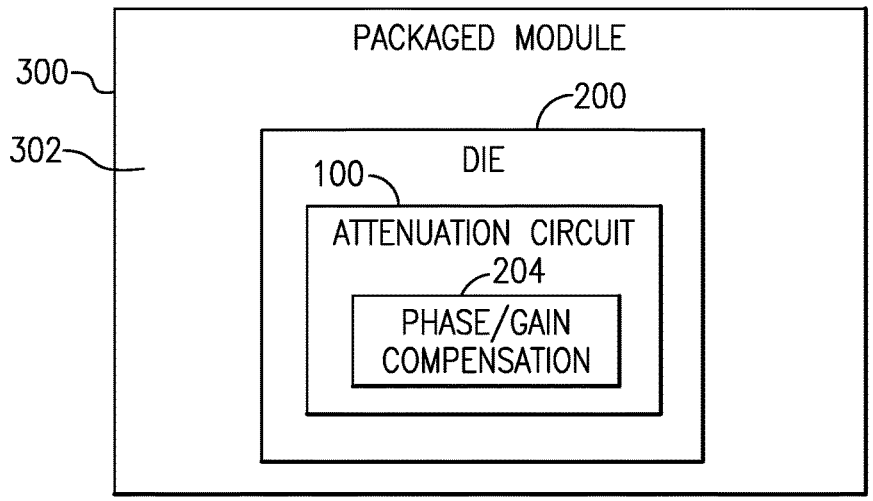
FIG. 20 shows an example where some or all of an attenuation circuit having one or more features as described herein can be implemented on a packaged module, and such a packaged module can include a semiconductor die similar to the example of FIG. 19.
Figure 21:
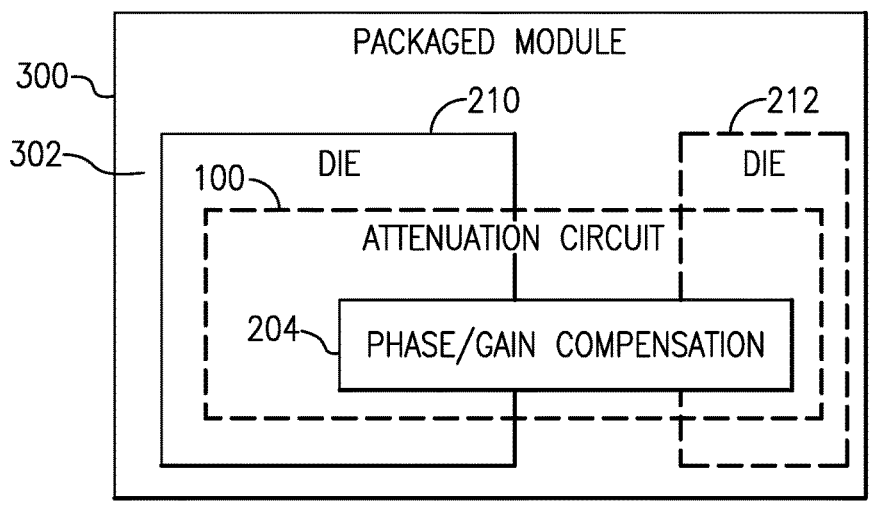
FIG. 21 shows another example where some or all of an attenuation circuit having one or more features as described herein can be implemented on a packaged module, and such a packaged module can include a plurality of semiconductor die.

FIGS. 20 and 21 show that in some embodiments, some or all of an attenuation circuit 100 having one or more features as described herein can be implemented on a packaged module 300. Such a module can include a packaging substrate 302 configured to receive a plurality of components such as one or more die and one or more passive components.

FIG. 20 shows that in some embodiments, the packaged module 300 can include a semiconductor die 200 that is similar to the example of FIG. 19. Accordingly, such a die can include some or all of the attenuation circuit 100, with at least some of a phase/gain compensation circuit 204 (e.g., either or both of global phase compensation circuit 108 and local phase compensation circuits 104a, 104b, 104c of FIG. 3) being implemented on the die 200.

FIG. 21 shows that in some embodiments, the packaged module 300 can include a first semiconductor die 210 having some of the attenuation circuit 100, while the rest of the attenuation circuit 100 is implemented on another die 212, outside of a die (e.g., on the packaging substrate 302), or any combination thereof. In such a configuration, some of a phase/gain compensation circuit 204 (e.g., either or both of global phase compensation circuit 108 and local phase compensation circuits 104a, 104b, 104c of FIG. 3) can be implemented on the first die 210, and the rest of the phase/gain compensation circuit 204 can be implemented on another die 212, outside of a die (e.g., on the packaging substrate 302), or any combination thereof.

Figure 22:
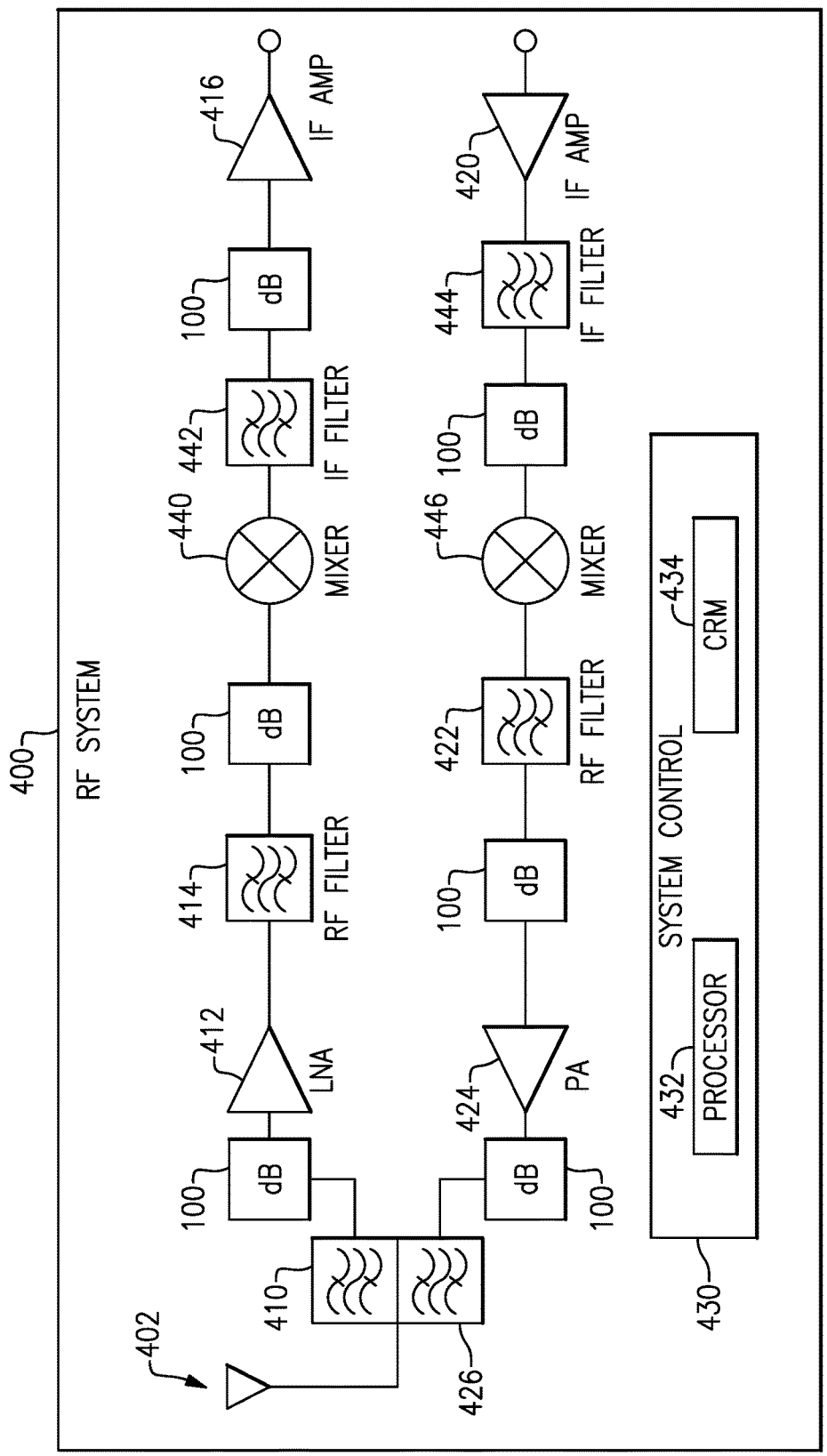
FIG. 22 shows non-limiting examples of how an attenuator having one or more features as described herein can be implemented in a radio-frequency system.

FIG. 22 shows non-limiting examples of how an attenuator having one or more features as described herein can be implemented in an RF system 400. Such an RF system can include an antenna 402 configured to facilitate reception and/or transmission of RF signals. In the context of reception, an RF signal received by the antenna 402 can be filtered (e.g., by a band-pass filter 410) and passed through an attenuator 100 before being amplified by a low-noise amplifier (LNA) 412. Such an LNA-amplified RF signal can be filtered (e.g., by a band-pass filter 414), passed through an attenuator 100, and routed to a mixer 440. The mixer 440 can operate with an oscillator (not shown) to yield an intermediate-frequency (IF) signal. Such an IF signal can be filtered (e.g., by a band-pass filter 442) and passed through an attenuator 100 before being routed to an intermediate-frequency (IF) amplifier 416. Some or all of the foregoing attenuators 100 along the receive path can include one or more features as described herein.

In the context of transmission, an IF signal can be provided to an IF amplifier 420. An output of the IF amplifier 420 can be filtered (e.g., by a band-pass filter 444) and passed through an attenuator 100 before being routed to a mixer 446. The mixer 446 can operate with an oscillator (not shown) to yield an RF signal. Such an RF signal can be filtered (e.g., by a band-pass filter 422) and passed through an attenuator 100 before being routed to a power amplifier (PA) 424. The PA-amplified RF signal can be routed to the antenna 402 through an attenuator 100 and a filter (e.g., a band-pass filter 426) for transmission. Some or all of the foregoing attenuators 100 along the transmit path can include one or more features as described herein.

In some embodiments, various operations associated with the RF system 400 can be controlled and/or facilitated by a system controller 430. Such a system controller can include, for example, a processor 432 and a storage medium such as a non-transient computer-readable medium (CRM) 434. In some embodiments, at least some control functionalities associated with the operation of one or more attenuators 100 in the RF system 400 can be performed by the system controller 430.

Figure 23:
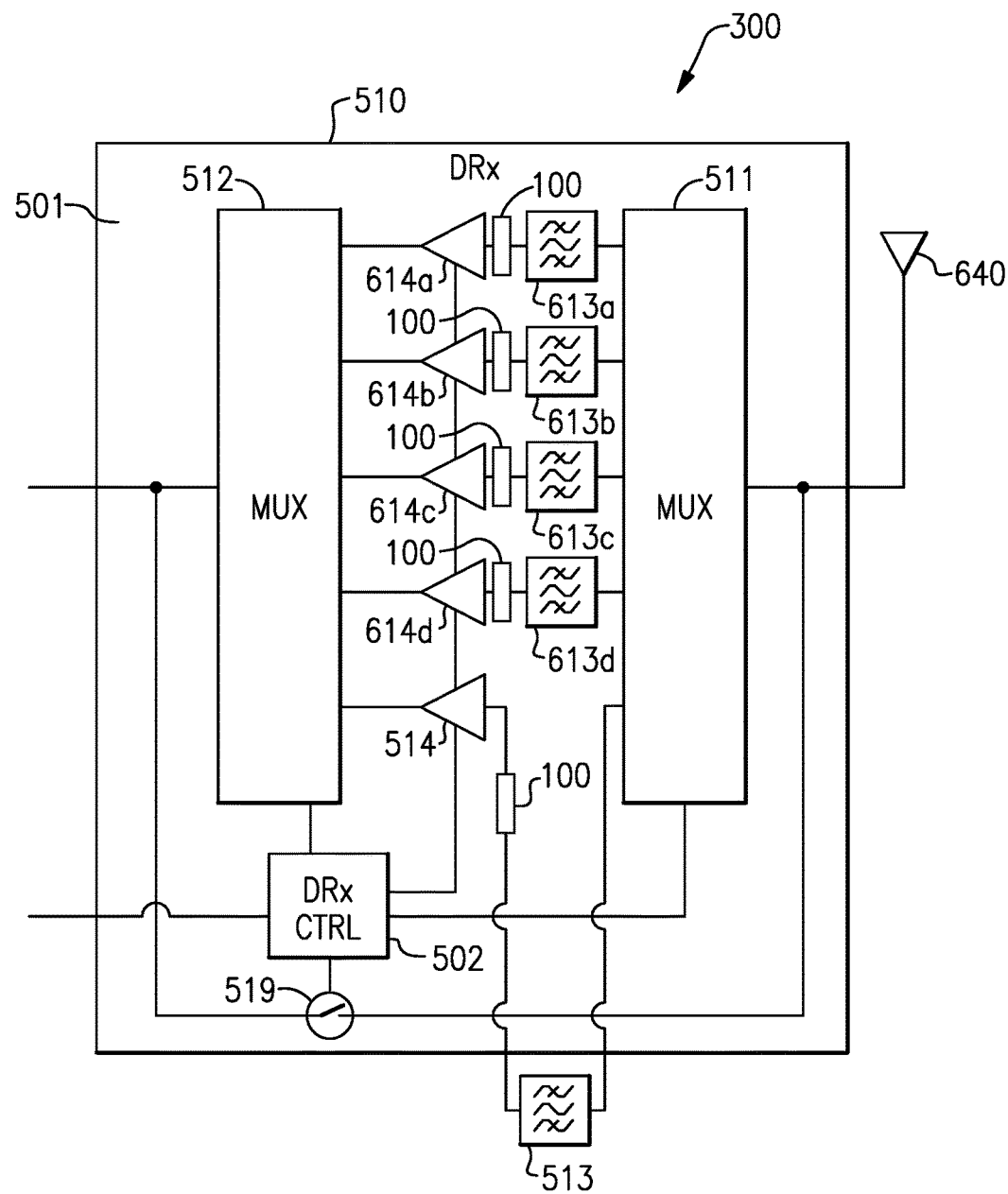
FIG. 23 shows an example of a diversity receive module that includes an attenuator having one or more features as described herein.

In some embodiments, an attenuation circuit having one or more features as described herein can be implemented along a receive (Rx) chain. For example, a diversity receive (DRx) module can be implemented such that processing of a received signal can be achieved close to a diversity antenna. FIG. 23 shows an example of such a DRx module.

In FIG. 23, a diversity receiver module 300 can be an example of the modules 300 of FIGS. 20 and 21. In some embodiments, such a DRx module can be coupled to an off-module filter 513. The DRx module 300 can include a packaging substrate 501 configured to receive a plurality of components and a receiving system implemented on the packaging substrate 501. The DRx module 300 can include one or more signal paths that are routed off the DRx module 300 and made available to a system integrator, designer, or manufacturer to support a filter for any desired band.

The DRx module 300 of FIG. 23 is shown to include a number of paths between the input and the output of the DRx module 300. The DRx module 300 is also shown to include a bypass path between the input and the output activated by a bypass switch 519 controlled by the DRx controller 502. Although FIG. 23 depicts a single bypass switch 519, in some implementations, the bypass switch 519 may include multiple switches (e.g., a first switch disposed physically close to the input and a second switch disposed physically close to the output). As shown in FIG. 23, the bypass path does not include a filter or an amplifier.

The DRx module 300 is shown to include a number of multiplexer paths including a first multiplexer 511 and a second multiplexer 512. The multiplexer paths include a number of on-module paths that include the first multiplexer 511, a bandpass filter 613a-613d implemented on the packaging substrate 501, an amplifier 614a-614d implemented on the packaging substrate 501, and the second multiplexer 512. The multiplexer paths include one or more off-module paths that include the first multiplexer 511, a bandpass filter 513 implemented off the packaging substrate 501, an amplifier 514, and the second multiplexer 512. The amplifier 514 may be a wide-band amplifier implemented on the packaging substrate 501 or may also be implemented off the packaging substrate 501. In some embodiments, the amplifiers 614a-614d, 514 may be variable-gain amplifiers and/or variable-current amplifiers.

A DRx controller 502 can be configured to selectively activate one or more of the plurality of paths between the input and the output. In some implementations, the DRx controller 502 can be configured to selectively activate one or more of the plurality of paths based on a band select signal received by the DRx controller 502 (e.g., from a communications controller). The DRx controller 502 may selectively activate the paths by, for example, opening or closing the bypass switch 519, enabling or disabling the amplifiers 614a-614d, 514, controlling the multiplexers 511, 512, or through other mechanisms. For example, the DRx controller 502 may open or close switches along the paths (e.g., between the filters 613a-613d, 513 and the amplifiers 614a-614d, 514) or by setting the gain of the amplifiers 614a-614d, 514 to substantially zero.

In the example DRx module 300 of FIG. 23, some or all of the amplifiers 614a-614d, 514 can be provided with an attenuation circuit 100 having one or more features as described herein. For example, each of such amplifiers is shown to have an attenuation circuit 100 implemented on its input side. In some embodiments, a given amplifier can have an attenuation circuit on its input side and/or on its output side.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 24:
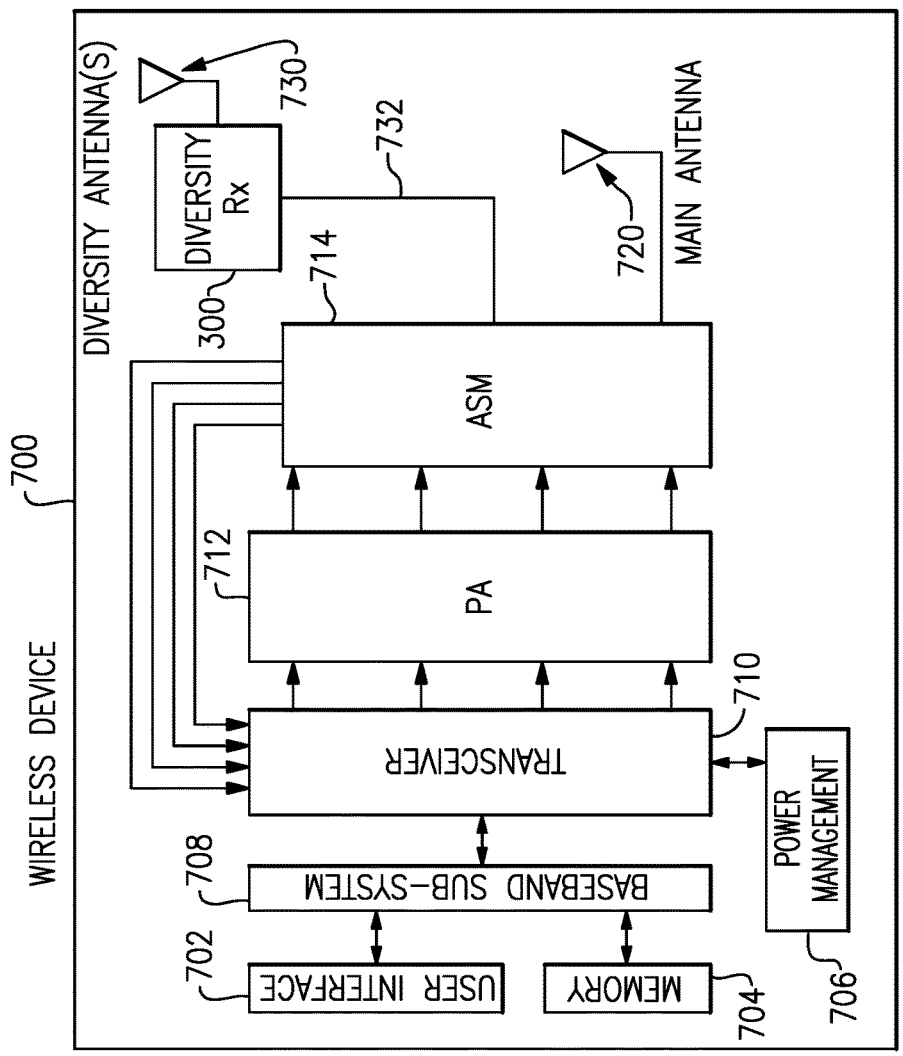
FIG. 24 depicts an example wireless device having one or more advantageous features described herein.

FIG. 24 depicts an example wireless device 700 having one or more advantageous features described herein. As described in reference to FIGS. 22 and 23, one or more attenuators having one or more features as described herein can be implemented in a number of places in such a wireless device. For example, in some embodiments, such advantageous features can be implemented in a module such as a diversity receive (DRx) module 300 having one or more low-noise amplifiers (LNAs). Such a DRx module can be configured as described herein in reference to FIGS. 20, 21 and 23. In some embodiments, an attenuator having one or more features as described herein can be implemented along an RF signal path before and/or after an LNA.

In the example of FIG. 24, power amplifiers (PAs) in a PA module 712 can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device 700. Such power management can also control operations of the baseband sub-system 708 and other components of the wireless device 700.

The baseband sub-system 708 is shown to be connected to a user interface 702 to facilitate various input and output of voice and/or data provided to and received from the user. The baseband sub-system 708 can also be connected to a memory 704 that is configured to store data and/or instructions to facilitate the operation of the wireless device, and/or to provide storage of information for the user.

In the example of FIG. 24, the DRx module 300 can be implemented between one or more diversity antennas (e.g., diversity antenna 730) and the ASM 714. Such a configuration can allow an RF signal received through the diversity antenna 730 to be processed (in some embodiments, including amplification by an LNA) with little or no loss of and/or little or no addition of noise to the RF signal from the diversity antenna 730. Such processed signal from the DRx module 300 can then be routed to the ASM through one or more signal paths.

In the example of FIG. 24, a main antenna 720 can be configured to, for example, facilitate transmission of RF signals from the PA module 712. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency attenuator circuit comprising:
an input node and an output node;
an attenuation path including a first switch, a first node, a plurality of attenuation blocks arranged in series, a second node, and a second switch between the input node and the output node, each attenuation block configured to provide a single resistance when providing attenuation, the attenuation block including a bypass switch configured to be on or off to thereby allow switchable bypassing of the single resistance, the bypass switch providing a single local off-capacitance when off, each of at least some of the attenuation blocks including a local phase compensation circuit configured to compensate for the single local off-capacitance of the respective bypass switch;

a global bypass path implemented between the input node and the output node to be parallel with the attenuation path, the global bypass path including a global bypass switch configured to be on or off to thereby allow switchable bypassing of the attenuation path including the first and second switches without incurring losses associated with the first and second switches, the global bypass switch having a global off-capacitance when off, each of the first and second switches of the attenuation path configured to be off when the global bypass switch is on, and on when the global bypass switch is off; and a global phase compensation circuit implemented between the first node and the second node, and configured to compensate for the global off-capacitance of the global bypass switch, each of the first and second switches implemented as a single-pole-single-throw switch configured to be on when the global bypass switch is off, the global phase compensation circuit configured to provide a fixed compensation phase value for the global off-capacitance of the global bypass switch and not for any of the first and second switches.

2. The attenuator circuit of claim 1 wherein the global phase compensation circuit includes a first global compensation resistance and a second global compensation resistance arranged in series, and a global compensation capacitance implemented between a ground and a node between the first and second global compensation resistances.

3. The attenuator circuit of claim 2 wherein the global off-capacitance of the global bypass switch results in a phase lead change, and the global phase compensation circuit is configured to provide a phase lag change to compensate for the phase lead change.

4. The attenuator circuit of claim 2 wherein the global compensation capacitance is configured to be affected substantially the same as the global bypass switch by one or more process variations.

5. The attenuator circuit of claim 4 wherein the global compensation capacitance is configured as a transistor-like device.

6. The attenuator circuit of claim 5 wherein each of the transistor-like device of the global compensation capacitance and the global bypass switch is implemented as a MOSFET device.

7. The attenuator circuit of claim 1 wherein the bypass switch of each attenuation block is configured to be on when in a local bypass mode and off when in a local attenuation mode with respect to the corresponding attenuation block.

8. The attenuator circuit of claim 1 wherein each attenuation block is configured as a pi-attenuator having a resistance, a first shunt path implemented between one end of the resistance and a ground, a second shunt path implemented between the other end of the resistance and the ground, each of the first and second shunt paths including a shunt resistance.

9. The attenuator circuit of claim 8 wherein the local phase compensation circuit includes a first local compensation capacitance arranged to be electrically parallel with the first shunt resistance, and a second local compensation capacitance arranged to be electrically parallel with the second shunt resistance.

10. The attenuator circuit of claim 9 wherein the local off-capacitance of the local bypass switch results in a phase lead change, and the local phase compensation circuit is configured to provide a phase lag change to compensate for the phase lead change.

11. The attenuator circuit of claim 9 wherein each of the first and second local compensation capacitances is configured to be affected substantially the same as the local bypass switch by one or more process variations.

12. The attenuator circuit of claim 11 wherein each of the first and second local compensation capacitances is configured as a transistor-like device.

13. The attenuator circuit of claim 12 wherein each of the transistor-like device of the first and second local compensation capacitances and the local bypass switch is implemented as a MOSFET device.

14. The attenuator circuit of claim 1 wherein at least some of the plurality of attenuation blocks are configured to provide binary-weighted attenuation values.

15. A radio-frequency module comprising:

a packaging substrate configured to receive a plurality of components; and a radio-frequency attenuator circuit implemented on the packaging substrate, the radio-frequency attenuator circuit including an input node and an output node, and an attenuation path including a first switch, a first node, a plurality of attenuation blocks arranged in series, a second node, and a second switch between the input node and the output node, each attenuation block configured to provide a single resistance when providing attenuation, the attenuation block including a bypass switch configured to be on or off to thereby allow switchable bypassing of the single resistance, the bypass switch providing a single local off-capacitance when off, each of at least some of the attenuation blocks including a local phase compensation circuit configured to compensate for the single local off-capacitance of the respective bypass switch, the radio-frequency attenuator circuit further including a global bypass path implemented between the input node and the output node to be parallel with the attenuation path, the global bypass path including a global bypass switch configured to be on or off to thereby allow switchable bypassing of the attenuation path including the first and second switches without incurring losses associated with the first and second switches, the global bypass switch having a global off-capacitance when off, each of the first and second switches of the attenuation path configured to be off when the global bypass switch is on, and on when the global bypass switch is off, the radio-frequency attenuator circuit further including a global phase compensation circuit implemented between the first node and the second node, and configured to compensate for the global off-capacitance of the global bypass switch, each of the first and second switches implemented as a single-pole-single-throw switch configured to be on when the global bypass switch is off, the global phase compensation circuit configured to provide a fixed compensation phase value for the global off-capacitance of the global bypass switch and not for any of the first and second switches.

16. The radio-frequency module of claim 15 wherein the radio-frequency module is configured to process a received radio-frequency signal.

17. A wireless device comprising:
an antenna configured to receive a radio-frequency signal;
a transceiver in communication with the antenna;
a signal path between the antenna and the transceiver; and
a radio-frequency attenuator circuit implemented along the signal path, the radio-frequency attenuator circuit including an input node and an output node, and an attenuation path including a first switch, a first node, a plurality of attenuation blocks arranged in series, a second node, and a second switch between the input node and the output node, each attenuation block configured to provide a single resistance when providing attenuation, the attenuation block including a bypass switch configured to be on or off to thereby allow switchable bypassing of the single resistance, the bypass switch providing a single local off-capacitance when off, each of at least some of the attenuation blocks including a local phase compensation circuit configured to compensate for the single local off-capacitance of the respective bypass switch, the radio-frequency attenuator circuit further including a global bypass path implemented between the input node and the output node to be parallel with the attenuation path, the global bypass path including a global bypass switch configured to be on or off to thereby allow switchable bypassing of the attenuation path including the first and second switches without incurring losses associated with the first and second switches, the global bypass switch having a global off-capacitance when off, each of the first and second switches of the attenuation path configured to be off when the global bypass switch is on, and on when the global bypass switch is off, the radio-frequency attenuator circuit further including a global phase compensation circuit implemented between the first node and the second node, and configured to compensate for the global off-capacitance of the global bypass switch, each of the first and second switches implemented as a single-pole-single-throw switch configured to be on when the global bypass switch is off, the global phase compensation circuit configured to provide a fixed compensation phase value for the global off-capacitance of the global bypass switch and not for any of the first and second switches.

* * * * *